United States Patent
Lim et al.

(10) Patent No.: US 9,543,475 B2
(45) Date of Patent: Jan. 10, 2017

(54) LIGHT EMITTING DEVICE AND METHOD OF MANUFACTURING THE SAME

(71) Applicants: Jin-young Lim, Gwacheon-si (KR);
Tan Sakong, Seoul (KR);
Byoung-kyun Kim, Seongnam-si (KR);
Jong-hak Kim, Hwaseong-si (KR)

(72) Inventors: Jin-young Lim, Gwacheon-si (KR);
Tan Sakong, Seoul (KR);
Byoung-kyun Kim, Seongnam-si (KR);
Jong-hak Kim, Hwaseong-si (KR)

(73) Assignee: SAMSUNG ELECTRONICS CO., LTD, Gyeonggi-do (KR)

( * ) Notice: Subject to any disclaimer, the term of this patent is extended or adjusted under 35 U.S.C. 154(b) by 0 days.

(21) Appl. No.: 14/940,720

(22) Filed: Nov. 13, 2015

(65) Prior Publication Data

US 2016/0141455 A1 May 19, 2016

(30) Foreign Application Priority Data

Nov. 14, 2014 (KR) ........................ 10-2014-0158907

(51) Int. Cl.
| | |
|---|---|
| *H01L 29/06* | (2006.01) |
| *H01L 31/0328* | (2006.01) |
| *H01L 31/0336* | (2006.01) |
| *H01L 31/072* | (2012.01) |
| *H01L 31/109* | (2006.01) |
| *H01L 21/66* | (2006.01) |

(Continued)

(52) U.S. Cl.
CPC ............ *H01L 33/24* (2013.01); *H01L 33/0075* (2013.01); *H01L 33/06* (2013.01); *H01L 33/22* (2013.01); *H01L 33/32* (2013.01); *H01L 2224/48091* (2013.01); *H01L 2924/181* (2013.01)

(58) Field of Classification Search
CPC .......... H01L 33/24; H01L 33/32; H01L 33/22; H01L 33/06; H01L 33/483
USPC ............................................. 257/13; 438/47
See application file for complete search history.

(56) References Cited

U.S. PATENT DOCUMENTS

| | | | |
|---|---|---|---|
| 6,372,608 B1 | 4/2002 | Shimoda et al. | |
| 6,645,830 B2 | 11/2003 | Shimoda et al. | |

(Continued)

FOREIGN PATENT DOCUMENTS

| | | |
|---|---|---|
| JP | 3612985 B2 | 1/2005 |
| JP | 2006-339534 A | 12/2006 |

(Continued)

*Primary Examiner* — David S Blum
(74) *Attorney, Agent, or Firm* — Harness, Dickey & Pierce, PLC

(57) ABSTRACT

A light-emitting device includes a first conductive type semiconductor layer, a second conductive type semiconductor layer, and an active layer between the first conductive type semiconductor layer and the second conductive type semiconductor layer and having a plurality of V-pits. The light-emitting device further includes a layer-quality improvement layer between the first conductive type semiconductor layer and the second conductive type semiconductor layer and having a plurality of V-pits with substantially same size and shape as the plurality of V-pits of the active layer, wherein layer-quality improvement layer is a group III-V semiconductor layer including Al or In. Due to the improved layer quality, the luminescent quality of the light-emitting device is improved.

32 Claims, 27 Drawing Sheets

(51) Int. Cl.
 *G01R 31/26* (2014.01)
 *H01L 33/24* (2010.01)
 *H01L 33/32* (2010.01)
 *H01L 33/22* (2010.01)
 *H01L 33/06* (2010.01)
 *H01L 33/00* (2010.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,625,104 B2 * | 12/2009 | Zhang ............... F21K 9/00 362/249.02 |
| 7,663,148 B2 | 2/2010 | Yi et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,039,830 B2 | 10/2011 | Kaneko et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,611 B2 | 12/2012 | Kaneko et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,502,254 B2 | 8/2013 | Hiraiwa et al. |
| 8,536,604 B2 | 9/2013 | Kwak et al. |
| 8,692,228 B2 | 4/2014 | Kaneko et al. |
| 8,735,931 B2 | 5/2014 | Han et al. |
| 8,766,295 B2 | 7/2014 | Kim |
| 8,785,965 B2 | 7/2014 | Yokogawa et al. |
| 2011/0309327 A1 * | 12/2011 | Jeong ............... H01L 33/32 257/13 |
| 2014/0131734 A1 * | 5/2014 | Ting ............... H01L 21/02505 257/76 |
| 2014/0209921 A1 | 7/2014 | Kusunoki et al. |
| 2014/0332756 A1 | 11/2014 | Kashihara et al. |

FOREIGN PATENT DOCUMENTS

| | | |
|---|---|---|
| JP | 2010-232649 A | 10/2010 |
| JP | 2011-082248 A | 4/2011 |
| JP | 5191843 B2 | 5/2013 |
| JP | 2013-120774 A | 6/2013 |
| JP | 2013-187484 A | 9/2013 |

* cited by examiner

FIG. 17

| APPLICATIONS | PHOSPHORS | |
|---|---|---|
| LED TV BLU | $\beta$-SiAlON:$Eu^{2+}$<br>(Ca,Sr)AlSiN$_3$:$Eu^{2+}$<br>L$_3$Si$_6$O$_{11}$:$Ce^{3+}$<br>K$_2$SiF$_6$: $Mn^{4+}$ | 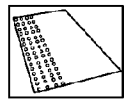 |
| LIGHTING | Lu$_3$Al$_5$O$_{12}$:$Ce^{3+}$<br>Ca-$\alpha$-SiAlON:$Eu^{2+}$<br>L$_3$Si$_6$N$_{11}$:$Ce^{3+}$<br>(Ca,Sr)AlSiN$_3$:$Eu^{2+}$<br>Y$_3$Al$_5$O$_{12}$:$Ce^{3+}$<br>K$_2$SiF$_6$: $Mn^{4+}$ | 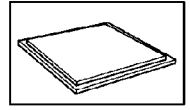 |
| Side view<br>(Mobile, Note PC) | Lu$_3$Al$_5$O$_{12}$:$Ce^{3+}$<br>Ca-$\alpha$-SiAlON:$Eu^{2+}$<br>L$_3$Si$_6$N$_{11}$:$Ce^{3+}$<br>(Ca,Sr)AlSiN$_3$:$Eu^{2+}$<br>Y$_3$Al$_5$O$_{12}$:$Ce^{3+}$<br>(Sr,Ba,Ca,Mg)$_2$SiO$_4$<br>K$_2$SiF$_6$: $Mn^{4+}$ | 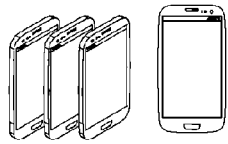 |
| ELECTRIC EQUIPMENT<br>(Head Lamp etc.) | Lu$_3$Al$_5$O$_{12}$:$Ce^{3+}$<br>Ca-$\alpha$-SiAlON:$Eu^{2+}$<br>L$_3$Si$_6$N$_{11}$:$Ce^{3+}$<br>(Ca,Sr)AlSiN$_3$:$Eu^{2+}$<br>Y$_3$Al$_5$O$_{12}$:$Ce^{3+}$<br>K$_2$SiF$_6$: $Mn^{4+}$ | 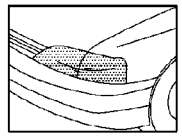 |

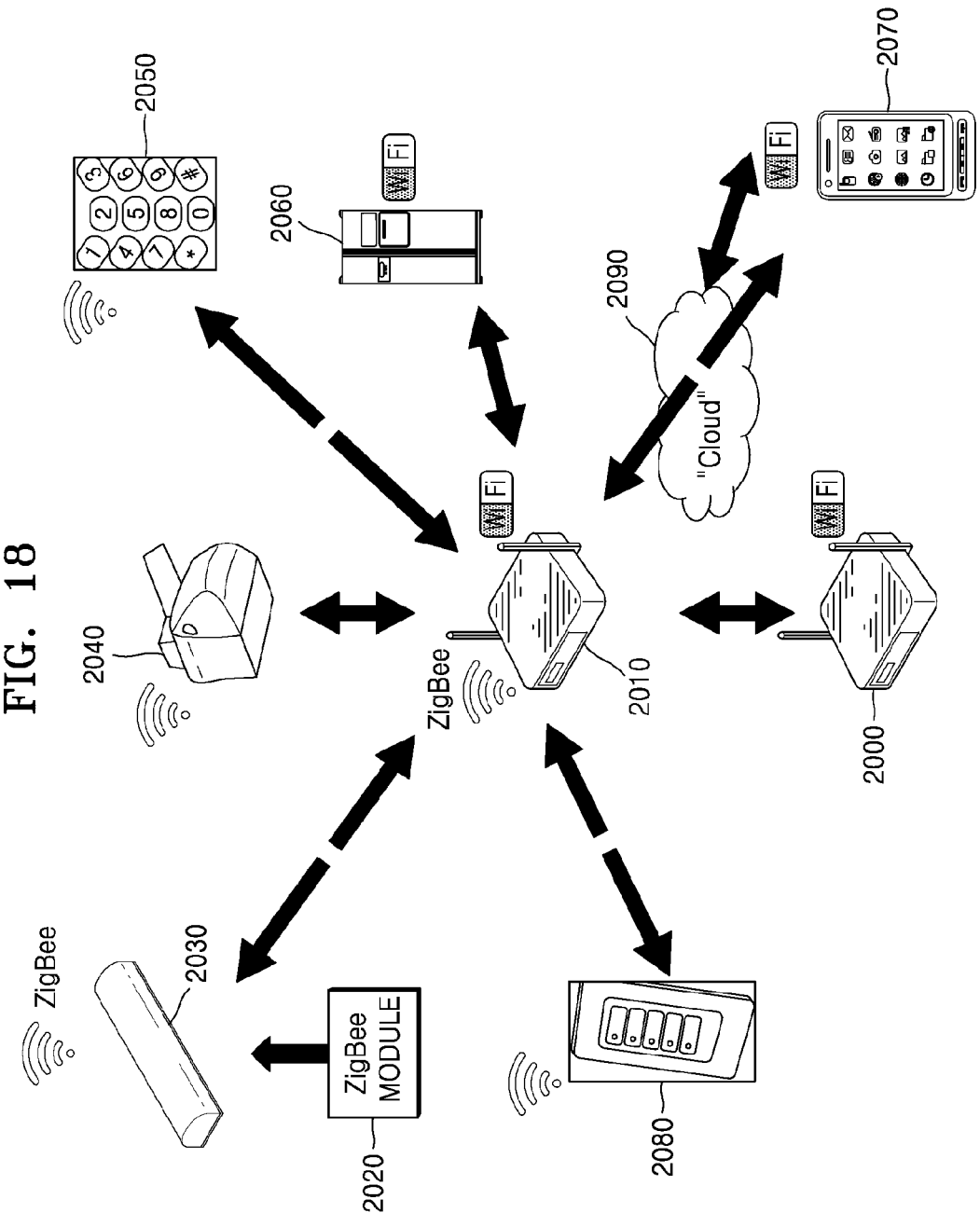

LIGHT EMITTING DEVICE AND METHOD OF MANUFACTURING THE SAME

CROSS-REFERENCE TO RELATED APPLICATION

This application claims the benefit of Korean Patent Application No. 10-2014-0158907, filed on Nov. 14, 2014, in the Korean Intellectual Property Office, the disclosure of which is incorporated herein in its entirety by reference.

BACKGROUND

The inventive concepts relate to a light-emitting device and a method of manufacturing the same, and more particularly, to a light-emitting device having an improved layer quality and thus improved emission, and a method of manufacturing the light-emitting device.

A semiconductor light-emitting device is a semiconductor device that generates light of various colors at a junction between first and second conductive type semiconductors based on recombination of electrons and holes in response to a current applied thereto. Compared to a filament-based light-emitting device, the semiconductor light-emitting device has many advantages such as long lifetime, lower power consumption, excellent initial drive characteristic, etc. Thus, the need for semiconductor light-emitting devices has constantly increased. In particular, recently, a group-III nitride semiconductor capable of emitting blue light in a short-wavelength region has been highlighted.

In general, a semiconductor light-emitting device has a structure including an active layer disposed between first and second conductive type semiconductor layers. However, when the active layer is grown, if coagulation of particles occurs, the quality of the active layer deteriorates, and thus, the luminescent quality may deteriorate.

SUMMARY

The inventive concepts provide a light-emitting device having an improved layer quality and thus improved emission.

The inventive concepts also provide a method of manufacturing a light-emitting device having an improved layer quality and thus improved emission.

According to an aspect of the inventive concepts, there is provided a light-emitting device including a first conductive type semiconductor layer; a second conductive type semiconductor layer; an active layer between the first conductive type semiconductor layer and the second conductive type semiconductor layer and having a plurality of V-pits; and a layer-quality improvement layer between the first conductive type semiconductor layer and the second conductive type semiconductor layer and having a plurality of V-pits with substantially same size and shape as the plurality of V-pits of the active layer, wherein the layer-quality improvement layer is a group III-V semiconductor layer including Al or In.

The layer-quality improvement layer may include $M_xGa_{1-x}N$, where M is Al or In and $0.01 \leq x \leq 0.3$. Also, the layer-quality improvement layer may be between the first conductive type semiconductor layer and the active layer. Also, a density of Al in the layer-quality improvement layer may be substantially constant.

A roughness of a surface of the layer-quality improvement layer that is an opposite surface with respect to the first conductive type semiconductor layer may be substantially less than a roughness of a surface of the first conductive type semiconductor layer at an interface between the layer-quality improvement layer and the first conductive type semiconductor layer. When measured via an atomic force microscope (AFM), the roughness of the surface of the layer-quality improvement layer that is the opposite surface with respect to the first conductive type semiconductor layer may be equal to or less than 60% of the roughness of the surface of the first conductive type semiconductor layer at the interface between the layer-quality improvement layer and the first conductive type semiconductor layer.

The light-emitting device may further include a V-pit generation layer between the first conductive type semiconductor layer and the layer-quality improvement layer. Here, the layer-quality improvement layer may be between the V-pit generation layer and the active layer.

The V-pit generation layer may have a plurality of V-pits that form the plurality of V-pits of the active layer, and the layer-quality improvement layer may be formed along a top surface of the V-pit generation layer. The layer-quality improvement layer may at least partially fill the plurality of V-pits of the V-pit generation layer. Also, the light-emitting device may further include a superlattice layer between the layer-quality improvement layer and the active layer.

The plurality of V-pits of the layer-quality improvement layer may be recessed into the plurality of V-pits of the V-pit generation layer, and the superlattice layer may have a plurality of V-pits recessed into the plurality of V-pits of the layer-quality improvement layer. Also, the plurality of V-pits of the active layer may be recessed into the plurality of V-pits of the superlattice layer.

The layer-quality improvement layer may have a multi-stack structure including a plurality of GaN layers and $M_xGa_{1-x}N$ layers that are alternately stacked, wherein M is Al or In and $0.01 \leq x \leq 0.3$. The layer-quality improvement layer may include a superlattice layer including GaN and $M_xGa_{1-x}N$, where M is Al or In and $0.01 \leq x \leq 0.3$.

Selectively, the layer-quality improvement layer may be between the active layer and the second conductive type semiconductor layer. Here, the plurality of V-pits of the layer-quality improvement layer may be covered by the second conductive type semiconductor layer.

The light-emitting device may further include a superlattice layer between the active layer and the first conductive type semiconductor layer, and the plurality of V-pits of the active layer may extend into the superlattice layer.

According to another aspect of the inventive concepts, there is provided a light-emitting device including a first conductive type semiconductor layer; a second conductive type semiconductor layer; an active layer between the first conductive type semiconductor layer and the second conductive type semiconductor layer; and a V-pit generation layer between the first conductive type semiconductor layer and the active layer, wherein a surface of the V-pit generation layer facing the active layer includes a region in which the concentration of Al is increased.

Here, the V-pit generation layer may include a GaN layer and the region of the surface of the V-pit generation layer includes $Al_xGa_{1-x}N$, where $0.01 \leq x \leq 0.3$. A thickness of the region of the surface of the V-pit generation layer may be about 5 through 20% of a thickness of the V-pit generation layer.

According to another aspect of the inventive concepts, there is provided a light-emitting package including a package substrate; the light-emitting device of the first aspect of the inventive concept, wherein the light-emitting device is mounted on a printed circuit board; and an encapsulation member that encapsulates the light-emitting device.

According to another aspect of the inventive concepts, there is provided a method of manufacturing a light-emitting device, the method including operations of forming a first conductive type semiconductor layer on a substrate; forming a V-pit generation layer having a plurality of V-pits on the first conductive type semiconductor layer; forming a layer-quality improvement layer on the V-pit generation layer; forming an active layer on the layer-quality improvement layer; and forming a second conductive type semiconductor layer on the active layer.

The operation of forming the layer-quality improvement layer may include operations of increasing a deposition temperature by about 100 through 15° C. with respect to a deposition temperature during the forming of the V-pit generation layer; and additionally supplying an M precursor, wherein M is Al or In.

Selectively, the operation of forming the layer-quality improvement layer may include operations of increasing a deposition temperature by about 100 through 15° C. with respect to a deposition temperature during the forming of the V-pit generation layer; additionally supplying an M precursor, wherein M is Al or In; and stopping the additionally supplying of the M precursor. Here, the operation of additionally supplying the M precursor and the operation of stopping the operation of additionally supplying may be repeated until the layer-quality improvement layer has a desired thickness.

According to an aspect of the inventive concepts, there is provided a light-emitting device comprising a first conductive type semiconductor layer; a second conductive type semiconductor layer; an active layer between the first conductive type semiconductor layer and the second conductive type semiconductor layer; and at least one surface roughness improvement layer, including at least one of Al and In, between the first conductive type semiconductor layer and the second conductive type semiconductor layer.

The at least one surface roughness improvement layer may be a layer-quality improvement layer comprising $M_xGa_{1-x}N$, where M is Al or In and $0.01 \leq x \leq 0.3$.

The at least one surface roughness improvement layer may be a V-pit generation layer comprising $Al_xGa_{1-x}N$, where $0.01 \leq x \leq 0.3$.

The at least one surface roughness improvement layer may include a layer-quality improvement layer and a V-pit generation layer.

BRIEF DESCRIPTION OF THE DRAWINGS

Exemplary embodiments of the inventive concepts will be more clearly understood from the following detailed description taken in conjunction with the accompanying drawings in which:

FIG. 17 illustrates phosphor types according to application fields of a white light-emitting apparatus using a blue light-emitting device, according to an example embodiment; and FIGS. 18 and 19 illustrate a home network to which a lighting system using the light-emitting device is applied, according to an example embodiment.

DETAILED DESCRIPTION OF EXAMPLE EMBODIMENTS

Figure 1:
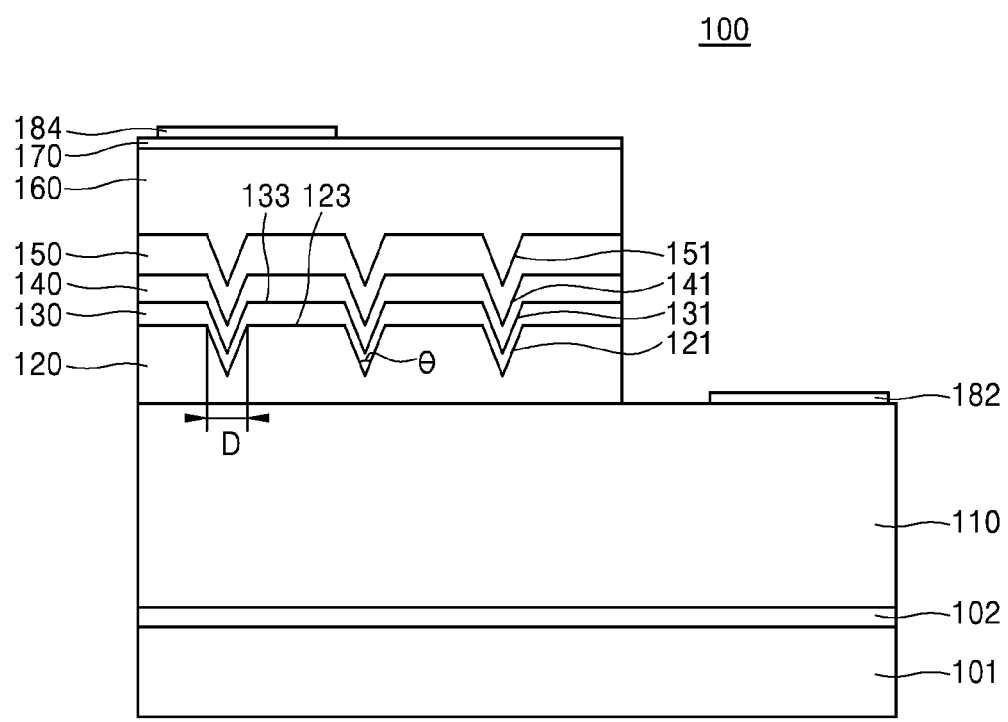
FIG. 1 is a cross-sectional side view of a light-emitting device, according to an example embodiment.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, example embodiments of the inventive concepts are not limited to the specific examples provided herein and are exaggerated for clarity.

The terminology used herein is for the purpose of describing example embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, example embodiments in the detailed description will be described with sectional views as ideal example views of the inventive concepts. Accordingly, shapes of the example views may be modified according to manufacturing techniques and/or allowable errors. Therefore, example embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some example embodiments could be termed a second element in other example embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various example embodiments described herein may be embodied in microelectronic devices such as integrated circuits, wherein a plurality of devices according to various example embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various example embodiments described herein may include a plurality of the devices in an array and/or in a two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view(s) illustrated herein provide support for a plurality of devices according to various example embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a cross-sectional side view of a light-emitting device 100, according to at least one example embodiment.

Referring to FIG. 1, the light-emitting device 100 has a structure in which a first conductive type semiconductor layer 110, a V-pit generation layer 120, a layer-quality improvement layer 130, a superlattice layer 140, an active layer 150, and/or a second conductive type semiconductor layer 160 are sequentially stacked on a substrate 101. Here, the first conductive type semiconductor layer 110, the V-pit generation layer 120, the layer-quality improvement layer 130, the superlattice layer 140, the active layer 150, and the second conductive type semiconductor layer 160 may be collectively referred to as an emission stack.

The substrate 101 may be disposed below the first conductive type semiconductor layer 110 and thus may support the first conductive type semiconductor layer 110. The substrate 101 may receive heat from the first conductive type semiconductor layer 110 and may externally radiate the received heat. Also, the substrate 101 may have a light-transmittance characteristic. If the substrate 101 is formed of a light-transmissive material or has a thickness equal to or less than a predetermined or desired value, the substrate 101 may have the light-transmittance characteristic. In order to increase a light extraction efficiency, the substrate 101 may have a refractive index that is less than that of the first conductive type semiconductor layer 110.

If required, the substrate 101 may be formed as an insulating substrate, a conductive substrate, or a semiconductor substrate. For example, the substrate 101 may include sapphire ($Al_2O_3$), gallium nitride (GaN), silicon (Si), germanium (Ge), gallium-arsenide (GaAs), zinc oxide (ZnO), silicon germanium (SiGe), silicon carbide (SiC), gallium oxide ($Ga_2O_3$), lithium gallium oxide ($LiGaO_2$), lithium aluminum oxide ($LiAlO_2$), or magnesium aluminum oxide ($MgAl_2O_4$). For an epitaxial growth of a GaN material, it may be advantageous to use a GaN substrate that is a homogeneous substrate; however, the GaN substrate has a high production cost due to difficulty in its manufacture.

An example of a heterogeneous substrate includes a sapphire substrate, a silicon carbide (SiC) substrate, a silicon substrate, or the like, and in this regard, the sapphire substrate or the silicon substrate is used more than the SiC substrate, which is expensive. When the heterogeneous substrate is used, a defect such as dislocation or the like is increased due to a difference between lattice constants of a substrate material and a thin-film material. Also, due to a difference between thermal expansion coefficients of the substrate material and the thin-film material, the substrate 101 may be bent when a temperature is changed, and the bend causes a crack of a thin-film. The aforementioned problem may be decreased by using a buffer layer 102 between the substrate 101 and the first conductive type semiconductor layer 110 that includes a GaN material.

In order to improve an optical or electrical characteristic of a light-emitting diode (LED) chip before or after an LED structure growth, the substrate 101 may be completely or partly removed or may be patterned while a chip is manufactured.

For example, a sapphire substrate may be separated in a manner in which a laser is irradiated to an interface between the sapphire substrate and a semiconductor layer, and a silicon substrate or a SiC substrate may be removed by using a polishing method, an etching method, or the like.

When the substrate 101 is removed, another supporting substrate may be used, and the supporting substrate may be bonded to the other side of an original growth substrate by using a reflective metal material or may be formed by inserting a reflection structure into an adhesion layer, so as to improve an optical efficiency of the LED chip.

A patterning operation on a substrate is performed to form an uneven or slope surface on a main side (e.g., a top surface or both surfaces) or side surfaces of the substrate before or after a growth of an LED structure, and by doing so, a light extraction efficiency is improved. A size of a pattern may be selected in a range from 5 nm to 500 μm, and in order to improve the light extraction efficiency, a regular pattern or an irregular pattern may be selected. In addition, a shape of the pattern may be a column, a cone, a hemisphere, a polygonal shape, or the like.

The sapphire substrate includes crystals having a hexagonal-rhombohedral (Hexa-Rhombo R3c) symmetry in which lattice constants of the crystal in c-axial and a-lateral directions are 13.001 and 4.758, respectively, and the crystal has a C (0001) surface, an A (1120) surface, an R(1102) surface, or the like. In at least one example embodiment, the C (0001) surface easily facilitates the growth of a nitride thin-film, and is stable at a high temperature, so that the C (0001) surface is commonly used as a substrate for the growth of nitride.

The substrate may be formed of a Si substrate that is more appropriate for a large diameter and has a relatively low price, so that mass production may be improved. However, since the Si substrate having a (111) surface as a substrate surface has a lattice constant difference of about 17% with GaN, a technology is required to suppress occurrence of a defective crystal due to the lattice constant difference. In addition, a thermal expansion difference between silicon and GaN is about 56%, so that a technology is required to suppress wafer bend caused due to the thermal expansion difference. Due to the wafer bend, a GaN thin-film may have a crack, and it may be difficult to control a process such that the uniformity of emission wavelength in a wafer may be decreased.

Since the Si substrate absorbs light that is generated in a GaN-based semiconductor, an external quantum efficiency of the light-emitting device 100 may deteriorate. Therefore, the Si substrate may be removed when required, and a supporting substrate such as Si, Ge, SiAl, ceramic, or metal substrates including a reflective layer may be additionally formed.

When the GaN thin-film is grown on a heterogeneous substrate such as the Si substrate, a dislocation density may be increased due to a mismatch between lattice constants of a substrate material and a thin-film material, and the crack and the bend may occur due to the thermal expansion difference. In order to reduce or prevent the dislocation and the crack of the emission stack, the buffer layer 102 is disposed between the substrate 101 and the emission stack. The buffer layer 102 increases the uniformity of the emission wavelength of the wafer by mitigating a bending of the substrate while the active layer is grown.

The buffer layer 102 may be formed of $Al_xIn_yGa_{(1-x-y)}N$ ($0 \leq x \leq 1$, $0 \leq y \leq 1$, $0 \leq x+y \leq 1$), in particular, GaN, AN, AlGaN, InGaN, or InGaNAlN, and when required, the buffer layer 102 may be formed of $ZrB_2$, $HfB_2$, ZrN, HfN, TiN, or the like. Also, the buffer layer 102 may be formed by combining a plurality of layers or by gradually varying composition of one of the aforementioned materials.

Since the Si substrate and the GaN thin-film has the large thermal expansion difference, when the GaN thin-film is grown on the Si substrate, the GaN thin-film is grown at a high temperature and then is cooled at a room temperature, and at this time, a tensile stress may be applied to the GaN thin-film due to the thermal expansion difference between the Si substrate and the GaN thin-film, such that a crack in the GaN thin-film may easily occur. In order to reduce or prevent the crack, a compressive stress may be applied to the GaN thin-film while the GaN thin-film is grown, so that the tensile stress may be compensated.

Due to the lattice constant difference between the Si substrate and the GaN thin-film, the GaN film grown on the Si substrate may be defective. Thus, when the Si substrate is used, a buffer layer having a composite structure may be employed so as to simultaneously perform a defect control and a stress control to suppress the bend.

For example, AlN is first formed on the substrate 101. In order to reduce or prevent reaction between Si and Ga, it is required to use a material that does not contain Ga. Not only AlN but also SiC may be used. AlN is grown by using Al and N sources at a temperature between 400 through 1300° C. When required, an AlGaN intermediate layer may be disposed between a plurality of AlN layers so as to control a stress.

The first and second conductive type semiconductor layers 110 and 160 may be formed of semiconductors that are doped with n-type and p-type impurities, respectively, or vice versa. For example, each of the first and second conductive type semiconductor layers 110 and 160 may be formed of, but is not limited to, the group-III nitride semiconductor, e.g., a material having the composition of $Al_xIn_yGa_{(1-x-y)}N$ ($0 \leq x \leq 1$, $0 \leq y \leq 1$, $0 \leq x+y \leq 1$). In at least one other example embodiment, each of the first and second conductive type semiconductor layers 110 and 160 may be formed of a material including an AlGaInP-based semiconductor, an AlGaAs-based semiconductor, or the like.

Each of the first and second conductive type semiconductor layers 110 and 160 may have a single-layer structure. However, when required, each of the first and second conductive type semiconductor layers 110 and 160 may have a multi-layer structure including a plurality of layers having different compositions or thicknesses. For example, each of the first and second conductive type semiconductor layers 110 and 160 may have a carrier injection layer capable of improving an efficiency of electron and hole injection, and may also have a superlattice structure having various forms.

The light-emitting device 100 may further include the V-pit generation layer 120 above the first conductive type semiconductor layer 110. In one or more embodiments, the V-pit generation layer 120 may be adjacent to the first conductive type semiconductor layer 110. For example, the V-pit generation layer 120 may have a defect density of about $1 \times 10^8$ cm$^{-2}$ through about $5 \times 10^9$ cm$^{-2}$. In one or more example embodiments, the V-pit generation layer 120 may have a thickness of about 200 nm through about 800 nm. Also, a width D of an opening of a V-pit 121 may be about 200 nm through about 800 nm.

The V-pit 121 formed in the V-pit generation layer 120 may have a vertical angle θ of about 20° through 90°. In other words, when the V-pit 121 is cut into a vertical plane that passes a vertex of the V-pit 121, an angle formed between each of two slopes that meet the vertical plane at the vertex may be about 20° through 90°.

In at least one example embodiment, the V-pit generation layer 120 may be a GaN layer or an impurity-doped GaN layer.

A position where the V-pit 121 is generated in the V-pit generation layer 120 may be controlled by a growth temperature. That is, if the growth temperature is relatively low, generation of the V-pit 121 may start at a lower position. On the other hand, if the growth temperature is relatively high, the generation of the V-pit 121 may start at a higher position.

When it is assumed that the V-pit generation layer 120 has a same height, if the generation of the V-pit 121 starts at a lower position, a top width of the V-pit 121 may be further increased.

A layer-quality improvement layer 130 may be arranged on the V-pit generation layer 120. The layer-quality improvement layer 130 may have a composition of $M_xGa_{1-x}N$, where M is Al or In and $0.01 \leq x \leq 0.3$. Alternatively, x may be in the range of $0.02 \leq x \leq 0.08$. If a value of x is too small, an effect of layer quality improvement may be small. On the other hand, if the value of x is too large, an emission characteristic may deteriorate.

The value of the x in the layer-quality improvement layer 130 may be constant.

Alternatively, the layer-quality improvement layer 130 may have a multistack structure in which a GaN layer and an $M_xGa_{1-x}N$ layer (here, M is Al or In, and $0.01 \leq x \leq 0.3$) are alternately stacked. Alternatively, the layer-quality improvement layer 130 may be a superlattice layer of GaN and $M_xGa_{1-x}N$ (here, M is Al or In, and $0.01 \leq x \leq 0.3$). A thickness of the layer-quality improvement layer 130 may be about 20 nm through about 100 nm.

The layer-quality improvement layer 130 may be formed on an entire top surface 123 of the V-pit generation layer 120. Also, the thickness of the layer-quality improvement layer 130 may be approximately constant in a vertical direction of the top surface 123 of the V-pit generation layer 120.

Also, a region of the layer-quality improvement layer 130 having a predetermined or desired thickness may cover an inner side of the V-pit 121 of the V-pit generation layer 120, and thus, layer-quality improvement layer 130 may at least partially fill the V-pit 121. A V-pit 131 of the layer-quality improvement layer 130 may be recessed into the V-pit 121 of the V-pit generation layer 120. A thickness of the layer-quality improvement layer 130 in a vertical direction of the top surface 123 of the V-pit generation layer 120 may be about 5 through 20% of a thickness of the V-pit generation layer 120.

The V-pit 131 formed in the layer-quality improvement layer 130 may have a dimension that is similar or equal to the V-pit 121 of the V-pit generation layer 120.

Also, a top surface 133 of the layer-quality improvement layer 130 may have a surface roughness that is further improved, compared to the top surface 123 of the V-pit generation layer 120. For example, the surface roughness of the top surface 133 of the layer-quality improvement layer 130 may be equal to or less than 60% of a surface roughness of the top surface 123 of the V-pit generation layer 120. The surface roughness may be measured by using an atomic force microscope (AFM). Also, the surface roughness is based on measurement on the top surfaces 123 and 133 excluding the V-pits 121 and 131. Also, it is possible to determine the surface roughness by measuring uniformity (evenness) of an interface. For example, uniformity of an interface adjacent to the layer-quality improvement layer 130 may be excellent, compared to uniformity of an interface adjacent to the V-pit generation layer 120.

As described above, since the surface roughness of the top surface 133 of the layer-quality improvement layer 130 is improved, a surface roughness of a barrier layer and a quantum well layer in the active layer 150 may also be improved. As a result, non-emission recombination of an electron and a hole may be decreased, so that an emission characteristic may be significantly improved.

The light-emitting device 100 may further include the superlattice layer 140 that is above the first conductive type semiconductor layer 110 and is adjacent to the active layer 150. The superlattice layer 140 may have a structure in which a plurality of $In_xAl_yGa_{(1-x-y)}N$ layers ($0 \leq x \leq 1$, $0 \leq y \leq 1$, $0 \leq x+y \leq 1$) having different compositions or different impurity levels are repeatedly stacked or may be a partial insulation material layer. The superlattice layer 140 may facilitate diffusion of current so as to make emission equally occur in a large area.

A V-pit 141 that corresponds to the V-pit 131 in the layer-quality improvement layer 130 may be formed in the superlattice layer 140.

A region of the superlattice layer 140 having a predetermined or desired thickness may cover an inner side of the V-pit 131 of the layer-quality improvement layer 130, and thus the superlattice layer 140 may at least partially fill the V-pit 131. The V-pit 141 of the superlattice layer 140 may be recessed into the V-pit 131 of the layer-quality improvement layer 130.

The second conductive type semiconductor layer 160 may further include an electron block layer that is adjacent to the active layer 150. The electron block layer may have a structure in which a plurality of $In_xAl_yGa_{(1-x-y)}N$ layers having different compositions are stacked or may have at least one layer formed of $Al_yGa_{(1-y)}N$. Since the electron block layer has a bandgap greater than that of the active layer 150, the electron block layer reduces or prevents electrons from entering to the second conductive type semiconductor layer 160 (that is a p-type).

The first conductive type semiconductor layer 110, the active layer 150, and the second conductive type semiconductor layer 160 may be formed by using a metal organic chemical vapor deposition (MOCVD) apparatus. In more detail, the first conductive type semiconductor layer 110, the active layer 150, and the second conductive type semiconductor layer 160 may be formed in a manner in which a reaction gas such as an organic metal compound gas (e.g., trimethylgallium (TMG), trimethylaluminum (TMA), or the like) and a nitrogen containing gas (e.g. ammonia ($NH_3$) or the like) are injected into a reaction container in which the substrate 101 is arranged and the substrate 101 is maintained at a high temperature of about 900 through 1100° C., while a gallium nitride compound semiconductor is grown on the substrate 101, if required, an impurity gas is injected, so that the gallium-based compound semiconductor is stacked as an undoped-type, an n-type, or a p-type. Si is well known as n-type impurity. Zn, Cd, Be, Mg, Ca, Ba, or the like, in particular, Mg and Zn, may be used as p-type impurity.

The active layer 150 that is disposed between the first and second conductive type semiconductor layers 110 and 160 may have a multi-quantum well (MQW) structure in which a quantum well layer and a quantum barrier layer are alternately stacked. For example, in a case of a nitride semiconductor, the active layer 150 may have a GaN/InGaN structure. However, in at least one other example embodiment, the active layer 150 may have a single-quantum well (SQW) structure.

A V-pit 151 that corresponds to the V-pit 141 in the superlattice layer 140 may be formed in the active layer 150.

A region of the active layer 150 having a predetermined or desired thickness may cover an inner side of the V-pit 141 of the superlattice layer 140, and thus the active layer 150 may at least partially fill the V-pit 141. The V-pit 151 of the active layer 150 may be recessed into the V-pit 141 of the superlattice layer 140. Also, the V-pit 151 of the active layer 150 may be covered by the second conductive type semiconductor layer 160.

The aforementioned V-pits 121, 131, 141, and 151 may be arranged at positions that correspond to each other, and may have the substantially same size or shape. Alternatively, one of the V-pits 121, 131, 141, and 151, which is formed later according to a fabrication order, may have a more gradual slope than a slope of a V-pit that is previously formed. Alternatively, one of the V-pits 121, 131, 141, and 151, which is formed later according to a fabrication order, may have an smaller opening than that of a V-pit that is previously formed.

The light-emitting device 100 may further include an ohmic electrode layer 170 on the second conductive type semiconductor layer 160. The ohmic electrode layer 170 may decrease an ohmic contact resistance by relatively increasing an impurity density, so that the ohmic electrode layer 170 may decrease an operating voltage and may improve a device characteristic. The ohmic electrode layer 170 may be formed of GaN, InGaN, ZnO, or a graphene layer.

The light-emitting device 100 may further include a first electrode 182 and a second electrode 184. The first electrode 182 and the second electrode 184 may include a material such as Ag, Ni, Al, Rh, Pd, Jr, Ru, Mg, Zn, Pt, Au, or the like, or may have a multi-layer structure including Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like.

While the LED chip shown in FIG. 1 has a structure in which the first electrode 182, the second electrode 184, and a light extraction surface face the same side, the LED chip may have various structures such as a flip-chip structure in which the first electrode 182 and the second electrode 184 face the opposite side of the light extraction surface, a vertical structure in which the first electrode 182 and the second electrode 184 are formed on opposite surfaces, a vertical and horizontal structure employing an electrode structure in which a plurality of vias are formed in a chip so as to increase an efficiency of current distribution and heat dissipation.

Figure 2A:
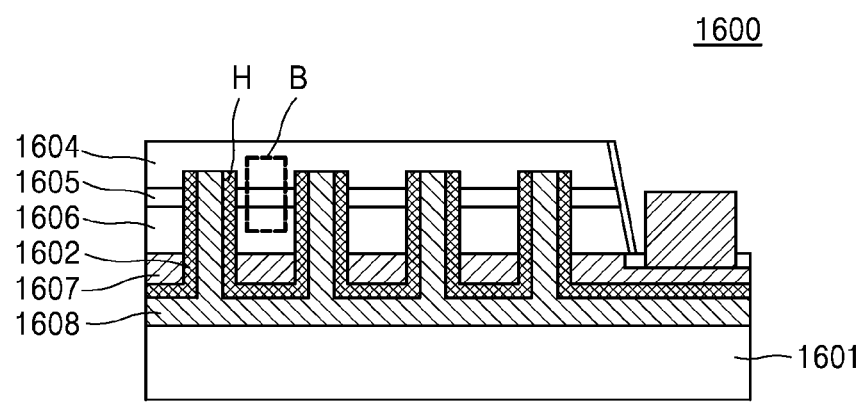
FIGS. 2A, 3A, and 4A are cross-sectional side views of light-emitting devices, according to example embodiments.
Figure 2B:
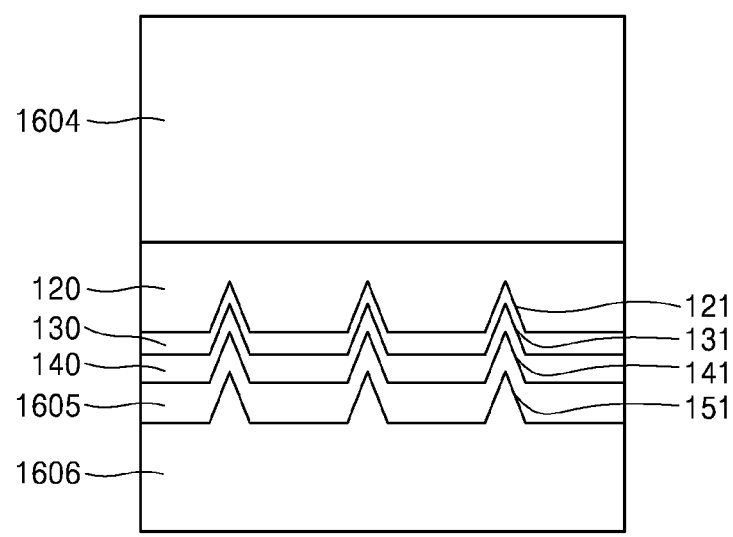
FIGS. 2B, 3B, and 4B illustrate in detail portions B shown in FIGS. 2A, 3A, and 4A, respectively.

FIG. 2A is a cross-sectional side view of an LED chip 1600 having a light-emitting device, according to at least one example embodiment. FIG. 2B illustrates in detail a portion B shown in FIG. 2A.

The LED chip 1600 shown in FIG. 2A may have a structure useful for increasing an efficiency of current distribution and heat dissipation, when a large area light-emitting device chip for a high output for a lighting apparatus is manufactured.

As illustrated in FIG. 2A, the LED chip 1600 includes a first conductive type semiconductor layer 1604, an active layer 1605, a second conductive type semiconductor layer 1606, a second electrode layer 1607, an insulating layer 1602, a first electrode layer 1608, and a substrate 1601 that are sequentially stacked. Here, in order to be electrically connected to the first conductive type semiconductor layer 1604, the first electrode layer 1608 includes one or more contact holes H that are electrically insulated from the second conductive type semiconductor layer 1606 and the active layer 1605 and that extend from a surface of the first electrode layer 1608 to a portion of the first conductive type semiconductor layer 1604. In the present embodiment, the first electrode layer 1608 is not an essential element The contact hole H extends from an interface of the first electrode layer 1608 to an inner surface of the first conductive type semiconductor layer 1604 via the second conductive type semiconductor layer 1606 and the active layer 1605. The contact hole H extends to an interface between the active layer 1605 and the first conductive type semiconductor layer 1604, for example, the contact hole H extends to the portion of the first conductive type semiconductor layer 1604. Since the contact hole H functions to perform electrical connection and current distribution of the first conductive type semiconductor layer 1604, the contact hole H achieves its purpose when the contact hole H contacts the first conductive type semiconductor layer 1604, thus, it is not required for the contact hole to extend to an outer surface of the first conductive type semiconductor layer 1604.

The second electrode layer 1607 that is formed on the second conductive type semiconductor layer 1606 may be formed of a material selected from the group consisting of Ag, Ni, Al, Rh, Pd, Ir, Ru, Mg, Zn, Pt, and Au, in consideration of a light reflection function and an ohmic contact with the second conductive type semiconductor layer 1606, and may be formed via a sputtering process or a deposition process.

The contact hole H has a shape that penetrates through the second electrode layer 1607, the second conductive type semiconductor layer 1606, and the active layer 1605 so as to be connected with the first conductive type semiconductor layer 1604. The contact hole H may be formed via an etching process using ICP-RIE or the like.

The insulating layer 1602 is formed to cover side walls of the contact hole H and a top surface of the second conductive type semiconductor layer 1606. In at least one example embodiment, a portion of the first conductive type semiconductor layer 1604 that corresponds to a bottom surface of the contact hole H may be exposed. The insulating layer 1602 may be formed by depositing an insulation material such as $SiO_2$, $SiO_xN_y$, $Si_xN_y$, or the like. The insulating layer 1602 may be deposited with a thickness range from about 0.01 μm to about 3 μm at a temperature of 500° C. or less via a CVD process.

The second electrode layer 1607 that includes a conductive via formed by filling a conductive material is formed in the contact hole H. A plurality of the vias may be formed in a light-emitting device region. The number of vias and a contact area of the vias may be adjusted so that an area of the vias that contact the first conductive type semiconductor layer 1604 is within a range between about 0.5% and about 20% of an area of the light-emitting device region. A planar radius of the area of the vias that contact the first conductive type semiconductor layer 1604 is within a range between about 1 μm and about 50 μm, and the number of vias may be between 1 and 48,000 for each light-emitting device region, according to an area of each light-emitting device region. Although the number of vias may vary according to the area of each light-emitting device region, the number of vias may be at least 3. A distance between the vias may correspond to a matrix array of rows and columns in the range between about 5 μm and about 500 μm, and in more detail, in the range between about 50 μm and about 450 μm. When the distance between the vias is less than about 5 μm, the number of vias is increased so that an emission area is relatively decreased such that an emission efficiency deteriorates. When the distance is greater than about 500 μm, a current spread may be difficult such that an emission efficiency may deteriorate. A depth of the contact hole H may vary according to a thickness of the second conductive type semiconductor layer 1606 and a thickness of the active layer 1605 and may be in the range between about 0.5 μm and about 10.0 μm.

Afterward, the substrate 1601 is formed on a surface of the first electrode layer 1608. In this structure, the substrate 1601 may be electrically connected to the first conductive type semiconductor layer 1604 via the conductive via that contacts the first conductive type semiconductor layer 1604.

The substrate 1601 may be formed of a material selected from the group consisting of Au, Ni, Al, Cu, W, Si, Se, GaAs, SiAl, Ge, SiC, AN, $Al_2O_3$, GaN, and AlGaN, via a plating process, a sputtering process, a deposition process, or an adhesion process. However, a material and a forming method with respect to the substrate 1601 are not limited thereto.

In order to decrease a contact resistance of the contact hole H, a total number of contact holes H, a shape of the contact hole H, a pitch of the contact hole H, a contact area of the contact hole H with respect to the first and second conductive type semiconductor layers 1604 and 1606, or the like may be appropriately adjusted, and since the contact holes H are arrayed in various forms along rows and columns, a current flow may be improved.

Referring to FIG. 2B, the first conductive type semiconductor layer 1604, a V-pit generation layer 120, a layer-quality improvement layer 130, a superlattice layer 140, the active layer 1605, and/or the second conductive type semiconductor layer 1606 are sequentially stacked.

Referring to FIG. 2B, unlike example embodiments of FIG. 1, a growth direction proceeds from a top toward a bottom, so that directions of V-pits 121, 131, 141, and 151 may be opposite to those in FIG. 1.

The first conductive type semiconductor layer 1604 and the second conductive type semiconductor layer 1606 may be formed of semiconductors that are doped with n-type and p-type impurities, respectively, but the first conductive type semiconductor layer 1604 and the second conductive type semiconductor layer 1606 are not limited thereto and thus may be p-type and n-type semiconductor layers, respectively. For example, the first conductive type semiconductor layer 1604 and the second conductive type semiconductor layer 1606 may be formed of, but are not limited to, a group-III nitride semiconductor, e.g., a material having a composition of $Al_xIn_yGa_{(1-x-y)}N$ ($0 \leq x \leq 1$, $0 \leq y \leq 1$, $0 \leq x+y \leq 1$). In at least one other example embodiment, each of the first and second conductive type semiconductor layers 1604 and 1606 may be formed of a material including an AlGaInP-based semiconductor, an AlGaAs-based semiconductor, or the like.

The V-pit generation layer 120, the layer-quality improvement layer 130, the superlattice layer 140, and the active layer 1605 are described above with reference to FIG. 1, and thus, detailed descriptions thereof are omitted here.

Figure 3A:
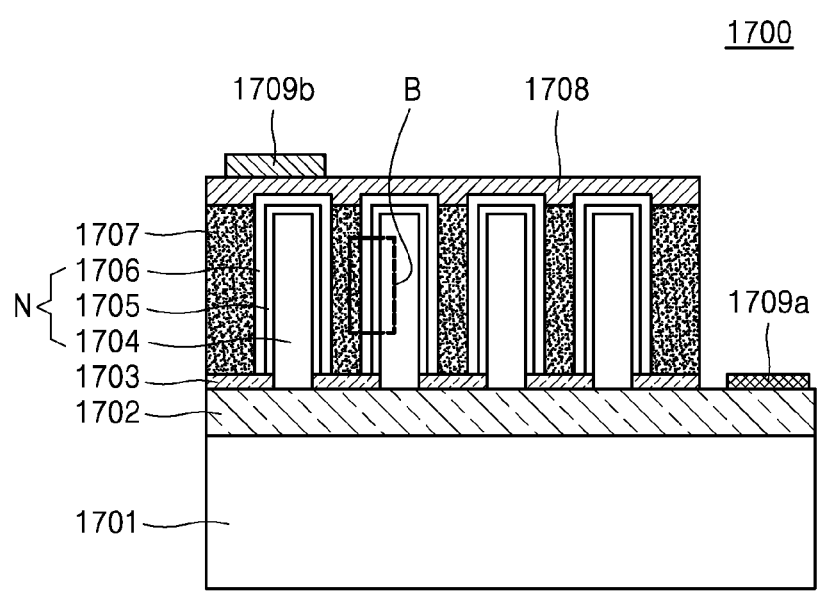
Figure 3B:
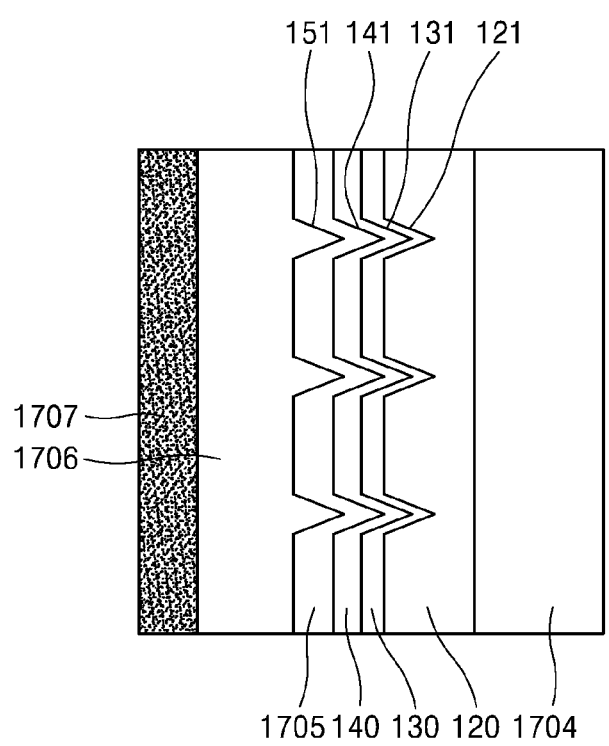

FIG. 3A is a cross-sectional side view of a light-emitting device 1700, according to at least one other example embodiment. FIG. 3B illustrates in detail a portion B shown in FIG. 3A.

Since an LED lighting apparatus provides an improved heat dissipation characteristic, it may be advantageous to apply an LED chip having a small calorific value to the LED lighting apparatus, in consideration of a total heat dissipation performance. An example of the LED chip may be an LED chip having a nano structure (hereinafter, referred to as a "nano LED chip").

An example of the nano LED chip includes a core-shell type nano LED chip. The core-shell type nano LED chip generates a relatively small amount of heat due to its smaller combined density, and increases its emission area by using the nano structure so as to increase emission efficiency. Also, the core-shell type nano LED chip may obtain a non-polar active layer, thereby reducing or preventing efficiency deterioration due to polarization, so that a drop characteristic may be improved.

As illustrated in FIG. 3A, the nano LED chip 1700 includes a plurality of nano emission structures N that are formed on a substrate 1701. In at least one example embodiment, the nano emission structure N has a rod structure as a core-shell structure, but in at least one other example embodiment, the nano emission structure N may have a different structure, such as a pyramid structure.

The nano LED chip 1700 includes a base layer 1702 formed on the substrate 1701. The base layer 1702 may be a layer to provide a growth surface for the nano emission structures N and may be formed of a first conductive type semiconductor. A mask layer 1703 having open areas for a growth of the nano emission structures N (in particular, a core) may be formed on the base layer 1702. The mask layer 1703 may be formed of a dielectric material such as $SiO_2$ or SiNx.

In the nano emission structure N, a first conductive nano core 1704 is formed by selectively growing the first conductive type semiconductor by using the mask layer 1703 having open areas, and an active layer 1705 and a second conductive type semiconductor layer 1706 are formed as a shell layer on a surface of the first conductive nano core 1704. By doing so, the nano emission structure N may have a core-shell structure in which the first conductive type semiconductor is a nano core, and the active layer 1705 and the second conductive type semiconductor layer 1706 that surround the nano core are the shell layer.

In at least one example embodiment, the nano LED chip 1700 includes a filling material 1707 that fills gaps between the nano emission structures N. The filling material 1707 may structurally stabilize the nano emission structures N. The filling material 1707 may include, but is not limited to, a transparent material such as $SiO_2$. An ohmic contact layer 1708 may be formed on the nano emission structure N so as to contact the second conductive type semiconductor layer 1706. The nano LED chip 1700 includes first and second electrodes 1709a and 1709b that contact the base layer 1702, which is formed of the first conductive type semiconductor, and the ohmic contact layer 1708, respectively.

By varying a diameter, a component, or a doping density of the nano emission structure N, light having at least two different wavelengths may be emitted from one device. By appropriately adjusting the light having the different wavelengths, white light may be realized in the one device without using a phosphor. In addition, by combining the one device with another LED chip or combining the one device with a wavelength conversion material such as a phosphor, light having desired various colors or white light having different color temperatures may be realized.

Referring to FIG. 3B, the first conductive nano core 1704 formed of a first conductive type semiconductor, a V-pit generation layer 120, a layer-quality improvement layer 130, a superlattice layer 140, the active layer 1705, and the second conductive type semiconductor layer 1706 are sequentially stacked.

In at least one example embodiment of FIG. 3B, after the first conductive nano core 1704 is formed, layers are formed on its surface. Thus, the layers are sequentially stacked in a direction away from a surface of the first conductive nano core 1704. Also, since the V-pit generation layer 120 formed on the surface of the first conductive nano core 1704 is grown in the same direction, an opening of a V-pit 121 faces outward, so that other V-pits 131, 141, and 151 are formed in the same direction.

The first conductive nano core 1704 and the second conductive type semiconductor layer 1706 may be formed of semiconductors that are doped with n-type and p-type impurities, respectively, but the first conductive nano core 1704 and the second conductive type semiconductor layer 1606 are not limited thereto and thus may be p-type and n-type semiconductor layers, respectively. For example, the first conductive nano core 1704 and the second conductive type semiconductor layer 1706 may be formed of, but are not limited to, the group-III nitride semiconductor, e.g., a material having a composition of $Al_xIn_yGa_{(1-x-y)}N$ ($0 \leq x \leq 1$, $0 \leq y \leq 1$, $0 \leq x+y \leq 1$). In at least one other example embodiment, each of the first conductive nano core 1704 and the second conductive type semiconductor layer 1706 may be formed of a material including an AlGaInP-based semiconductor, an AlGaAs-based semiconductor, or the like.

The V-pit generation layer 120, the layer-quality improvement layer 130, the superlattice layer 140, and the active layer 1705 are described above with reference to FIG. 1, and thus, detailed descriptions thereof are omitted here.

Figure 4A:
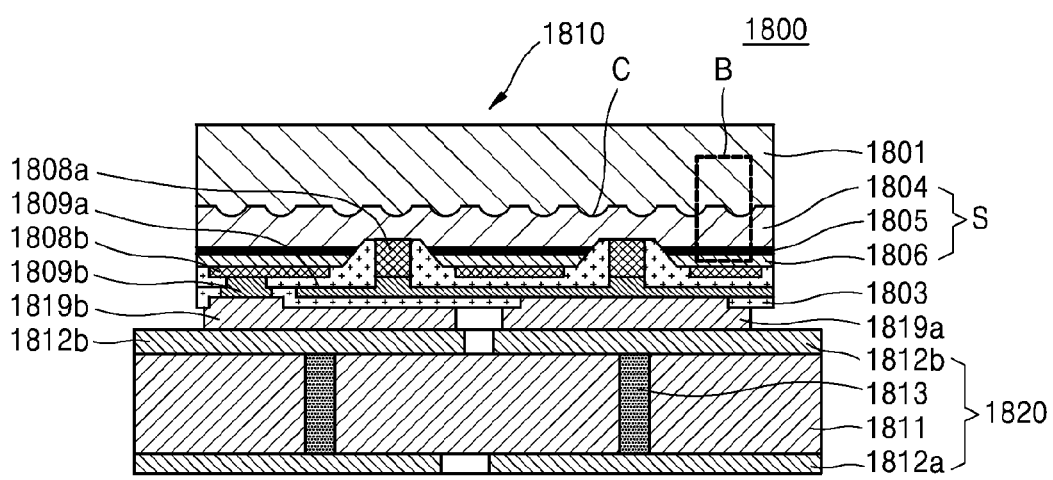
Figure 4B:
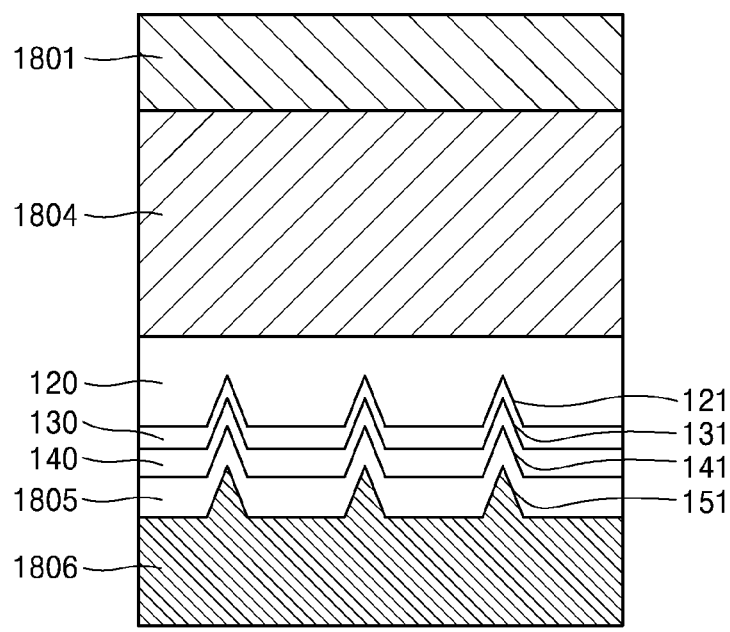

FIG. 4A is a cross-sectional side view of a light-emitting device 1800, according to at least one other example embodiment. FIG. 4B illustrates in detail a portion B shown in FIG. 4A.

FIG. 4A illustrates a semiconductor light-emitting device 1800 that is a light source to be applied to a light source package and includes an LED chip 1810 mounted on a mounting substrate 1820.

The semiconductor light-emitting device 1800 shown in FIG. 4A includes the mounting substrate 1820 and the LED chip 1810 that is mounted on the mounting substrate 1820. The LED chip 1810 is different from the LED chips in the aforementioned embodiments.

The LED chip 1810 includes an emission stack S that is disposed on a surface of the substrate 1801, and first and second electrodes 1808a and 1808b that are disposed on the other surface of the substrate 1801 with respect to the emission stack S. Also, the LED chip 1810 includes an insulation unit 1803 to cover the first and second electrodes 1808a and 1808b.

The first and second electrodes 1808a and 1808b may be connected to first and second electrode pads 1819a and 1819b via first and second electric power connection units 1809a and 1809b.

The emission stack S may include a first conductive type semiconductor layer 1804, an active layer 1805, and a second conductive type semiconductor layer 1806 that are sequentially disposed on the substrate 1801. The first electrode 1808a may be provided as a conductive via that contacts the first conductive type semiconductor layer 1804 by penetrating through the second conductive type semiconductor layer 1806 and the active layer 1805. The second electrode 1808b may contact the second conductive type semiconductor layer 1806.

A plurality of the vias may be formed in a light-emitting device region. The number of vias and a contact area of the vias may be adjusted so that an area of the vias that contact a first conductive-type semiconductor is within a range between about 0.5% and about 20% of an area of the light-emitting device region. A planar radius of the area of the vias that contact the first conductive-type semiconductor is within a range between about 1 µm and about 50 µm, and the number of vias may be between 1 and 48,000 vias for each light-emitting device region, according to an area of each light-emitting device region. Although the number of vias may vary according to the area of each light-emitting device region, the number of vias may be at least 3. A distance between the vias may correspond to a matrix array of rows and columns in the range between about 5 µm and about 500 µm, and in more detail, in the range between about 150 µm and about 450 µm. When the distance between the vias is less than about 100 µm, the number of vias is increased so that an emission area is relatively decreased such that an emission efficiency deteriorates. However, when the distance is greater than about 500 µm, a current spread may be difficult such that an emission efficiency may deteriorate. A depth of the contact hole H may vary according to a second semiconductor layer and an active layer and may be in the range between about 0.5 µm and about 5.0 µm.

A conductive ohmic material is deposited on the emission stack S so that the first and second electrodes 1808a and 1808b are formed. The first electrode 1808a and the second electrode 1808b may be an electrode including at least one material selected from the group consisting of Ag, Al, Ni, Cr, Cu, Au, Pd, Pt, Sn, Ti, W, Rh, Ir, Ru, Mg, Zn, and an alloy thereof. For example, the second electrode 1808b may be formed as an ohmic electrode including an Ag layer deposited with respect to the second conductive type semiconductor layer 1806. The Ag-ohmic electrode functions to reflect light. Selectively, a single layer including Ni, Ti, Pt, or W or a layer of an alloy thereof may be alternately stacked on the Ag layer. In more detail, a Ni/Ti layer, a TiW/Pt layer, or a Ti/W layer may be stacked below the Ag layer or the aforementioned layers may be alternately stacked below the Ag layer.

The first electrode 1808a may be formed in a manner that a Cr layer may be stacked with respect to the first conductive type semiconductor layer 1804 and then Au/Pt/Ti layers may be sequentially stacked on the Cr layer, or an Al layer may be stacked with respect to the second conductive type semiconductor layer 1806 and then Ti/Ni/Au layers may be sequentially stacked on the Al layer.

In order to improve an ohmic characteristic or a reflective characteristic, the first and second electrodes 1808a and 1808b may be formed of various materials or may have various stacking structures, other than the aforementioned materials and structures.

The insulation unit 1803 may have an open area to expose a portion of the first and second electrodes 1808a and 1808b, and the first and second electrode pads 1819a and 1819b may contact the first and second electrodes 1808a and 1808b. The insulation unit 1803 may be formed by depositing $SiO_2$ and/or SiN via a CVD process at a temperature about 500° C. or less and may have a thickness between about 0.01 µm and about 3 µm.

The first and second electrodes 1808a and 1808b may be disposed in the same direction, and as will be described later, the first and second electrodes 1808a and 1808b may be mounted in the form of a flip-chip in a lead frame. In at least one example embodiment, the first and second electrodes 1808a and 1808b may be disposed to face in the same direction.

In particular, the first electric power connection unit 1809a may be formed by the first electrode 1808a having a conductive via that penetrates through the active layer 1805 and the second conductive type semiconductor layer 1806 and then is connected to the first conductive type semiconductor layer 1804 in the emission stack S.

In order to decrease a contact resistance between the conductive via and the first electric power connection unit 1809a, a total number, shapes, pitches, a contact area with the first conductive type semiconductor layer 1804, or the like of the conductive via and the first electric power connection unit 1809a may be appropriately adjusted, and since the conductive via and the first electric power connection unit 1809a are arrayed in rows and columns, a current flow may be improved.

An electrode structure of the other side of the semiconductor light-emitting device 1800 may include the second electrode 1808b that is directly formed on the second conductive type semiconductor layer 1806, and the second electric power connection unit 1809b that is formed on the second electrode 1808b. The second electrode 1808b may function to form an electrical ohmic connection with the second electric power connection unit 1809b and may be formed of a light reflection material, so that, when the LED chip 1810 is mounted as a flip-chip structure, the second electrode 1808b may efficiently discharge light, which is emitted from the active layer 1805, toward the substrate 1801. Obviously, according to a major light emission direction, the second electrode 1808b may be formed of a light-transmitting conductive material such as transparent conductive oxide.

The aforementioned two electrode structures may be electrically separated from each other by using the insulation unit 1803. Any material or any object having an electrical insulation property may be used as the insulation unit 1803, but it may be advantageous to use a material having a low light-absorption property. For example, silicon oxide or silicon nitride such as $SiO_2$, $SiO_xN_y$, $Si_xN_y$, or the like may be used. When required, the insulation unit 1803 may have a light reflection structure in which a light reflective filler is distributed throughout a light transmitting material.

The first and second electrode pads 1819a and 1819b may be connected to the first and second electric power connection units 1809a and 1809b, respectively, and thus may function as external terminals of the LED chip 1810. For example, the first electrode pad 1819a and the second electrode pad 1819b may be formed of Au, Ag, Al, Ti, W, Cu, Sn, Ni, Pt, Cr, NiSn, TiW, AuSn, or a eutectic alloy thereof. In at least one example embodiment, when the first and second electrode pads 1819a and 1819b are mounted on the mounting substrate 1820, the first and second electrode pads 1819a and 1819b may be bonded to the mounting substrate 1820 by using eutectic metal, so that a separate solder bump that is generally used in flip-chip bonding may not be used. Compared to a case of using the solder bump, the mounting method using the eutectic metal may achieve a more excellent heat dissipation effect. In at least one example embodiment, in order to obtain the excellent heat dissipation effect, the first and second electrode pads 1819a and 1819b may be formed while having large areas.

The substrate 1801 and the emission stack S may be understood by referring to the aforementioned descriptions, unless contrary description is provided. Also, although not particularly illustrated, a buffer layer may be formed between the emission stack S and the substrate 1801, and in this regard, the buffer layer may be formed as a undoped semiconductor layer including nitride or the like, so that the buffer layer may decrease a lattice defect of an emission structure that is grown on the buffer layer.

The substrate 1801 may have first and second primary surfaces that face each other, and in this regard, a convex-concave structure C may be formed on at least one of the first and second primary surfaces. The convex-concave structure C that is arranged on one surface of the substrate 1801 may be formed of the same material as the substrate 1801 since a portion of the substrate 1801 is etched, or may be formed of a different material from the substrate 1801.

As in at least one example embodiment, since the convex-concave structure C is formed at an interface between the substrate 1801 and the first conductive type semiconductor layer 1804, a path of light emitted from the active layer 1805 may vary, such that a rate of light that is absorbed in the semiconductor layer may be decreased and a light-scattering rate may be increased; thus, the light extraction efficiency may be increased.

For example, the convex-concave structure C may have a regular shape or an irregular shape. Heterogeneous materials that form the convex-concave structure C may include a transparent conductor, a transparent insulator, or a material having excellent reflectivity. In this regard, the transparent insulator may include, but is not limited to, $SiO_2$, SiNx, $Al_2O_3$, HfO, $TiO_2$, or ZrO, the transparent conductor may include, but is not limited to, TCO such as indium oxide containing ZnO or an additive including Mg, Ag, Zn, Sc, Hf, Zr, Te, Se, Ta, W, Nb, Cu, Si, Ni, Co, Mo, Cr, or Sn, and the reflective material may include, but is not limited to, Ag, Al, or DBR that is formed of a plurality of layers having different refractive indexes.

The substrate 1801 may be removed from the first conductive type semiconductor layer 1804. In order to remove the substrate 1801, a laser lift off (LLO) process using a laser, an etching process, or a grinding process may be performed. After the substrate 1801 is removed, the convex-concave structure C may be formed on a top surface of the first conductive type semiconductor layer 1804.

As illustrated in FIG. 4A, the LED chip 1810 is mounted on the mounting substrate 1820. The mounting substrate 1820 has a structure in which upper and lower electrode layers 1812b and 1812a are formed on a top surface and a bottom surface of a substrate body 1811, respectively, and a via 1813 penetrates through the substrate body 1811 so as to connect the upper and lower electrode layers 1812b and 1812a. The substrate body 1811 may be formed of resin, ceramic, or metal, and the upper and lower electrode layers 1812b and 1812a may be metal layers including Au, Cu, Ag, Al, or the like.

An example of a substrate on which the LED chip 1810 is mounted is not limited to the mounting substrate 1820 of FIG. 4A, and thus any substrate having a wiring structure to drive the LED chip 1810 may be used. For example, a package structure may be provided in which the LED chip 1810 is mounted in a package body having a pair of lead frames.

Referring to FIG. 4B, the first conductive type semiconductor layer 1804, a V-pit generation layer 120, a layer-quality improvement layer 130, a superlattice layer 140, the active layer 1805, and/or the second conductive type semiconductor layer 1806 are sequentially stacked on the substrate 1801.

Referring to FIG. 4B, unlike at least one example embodiment of FIG. 1, a growth direction proceeds from a top toward a bottom, so that directions of V-pits 121, 131, 141, and 151 may be opposite to those in FIG. 1.

The first conductive type semiconductor layer 1804 and the second conductive type semiconductor layer 1806 may be formed of semiconductors that are doped with n-type and p-type impurities, respectively, but the first conductive type semiconductor layer 1804 and the second conductive type semiconductor layer 1806 are not limited thereto and thus may be p-type and n-type semiconductor layers, respectively. For example, the first conductive type semiconductor layer 1804 and the second conductive type semiconductor layer 1806 may be formed of, but are not limited to, the group-III nitride semiconductor, e.g., a material having a composition of $Al_xIn_yGa_{(1-x-y)}N$ ($0 \le x \le 1$, $0 \le y \le 1$, $0 \le x+y \le 1$). In at least one other example embodiment, each of the first and second conductive type semiconductor layers 1804 and 1806 may be formed of a material including an AlGaInP-based semiconductor, an AlGaAs-based semiconductor, or the like.

The V-pit generation layer 120, the layer-quality improvement layer 130, the superlattice layer 140, and the active layer 1805 are described above with reference to FIG. 1, and thus, detailed descriptions thereof are omitted here.

Figure 5:
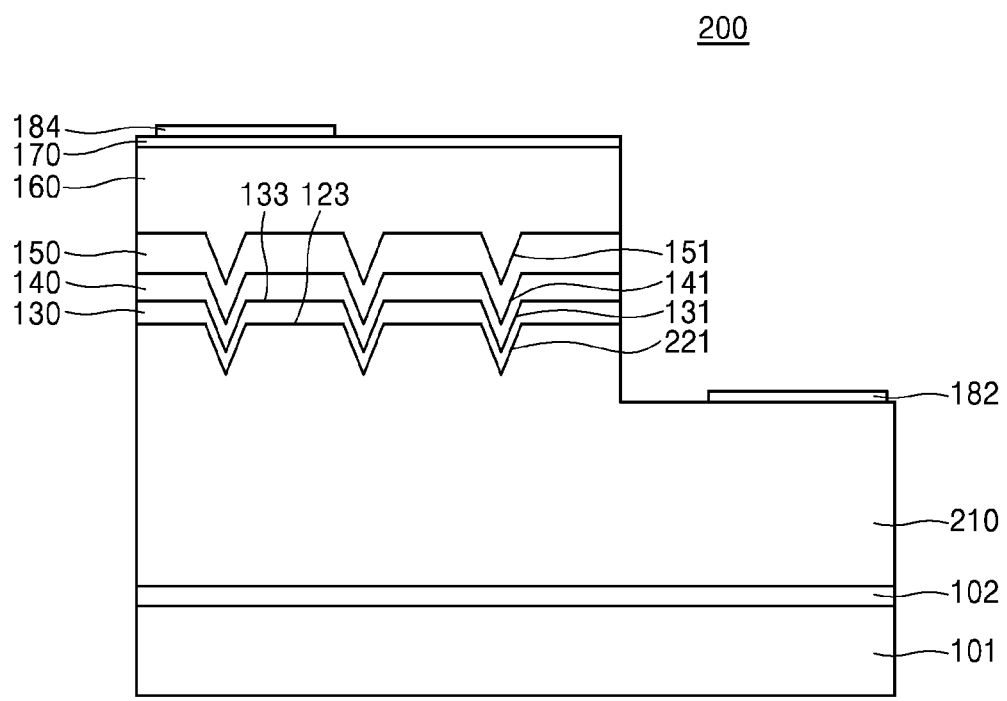
FIGS. 5 and 6 are cross-sectional side views of light-emitting devices, according to other example embodiments.

FIG. 5 is a cross-sectional side view of a light-emitting device 200, according to at least one other example embodiment.

Referring to FIG. 5, the light-emitting device 200 has a structure in which a first conductive type semiconductor layer 210, a layer-quality improvement layer 130, a superlattice layer 140, an active layer 150, and/or a second conductive type semiconductor layer 160 are sequentially stacked on a substrate 101. In at least one example embodiment, the first conductive type semiconductor layer 210, the layer-quality improvement layer 130, the superlattice layer 140, the active layer 150, and the second conductive type semiconductor layer 160 may be collectively referred to as an emission stack.

The substrate 101 and a buffer layer 102 are described above with reference to FIG. 1, and thus, detailed descriptions thereof are omitted here.

The first conductive type semiconductor layer 210 and the second conductive type semiconductor layer 160 may be formed of semiconductors that are doped with n-type and p-type impurities, respectively, but the first conductive type semiconductor layer 210 and the second conductive type semiconductor layer 160 are not limited thereto and thus may be p-type and n-type semiconductor layers, respectively. For example, the first conductive type semiconductor layer 210 and the second conductive type semiconductor layer 160 may be formed of, but are not limited to, the group-III nitride semiconductor, e.g., a material having a composition of $Al_xIn_yGa_{(1-x-y)}N$ ($0 \le x \le 1$, $0 \le y \le 1$, $0 \le x+y \le 1$). In at least one other example embodiment, each of the first and second conductive type semiconductor layers 210 and 160 may be formed of a material including an AlGaInP-based semiconductor, an AlGaAs-based semiconductor, or the like.

Each of the first and second conductive type semiconductor layers 210 and 160 may have a single-layer structure. However, each of the first and second conductive type semiconductor layers 210 and 160 may have a multi-layer structure including a plurality of layers having different compositions or thicknesses. For example, each of the first and second conductive type semiconductor layers 210 and 160 may have a carrier injection layer capable of improving an efficiency of electron and hole injection, and may also have a superlattice structure having various forms.

For example, the first conductive type semiconductor layer 210 may include an n-type GaN contact layer having a thickness of 1 μm through 5 μm and formed of silicon (Si) that is doped with an n-type dopant with a density of $2 \times 10^{18}$ cm$^{-3}$ through $9 \times 10^{19}$ cm$^{-3}$. The second conductive type semiconductor layer 160 may further include an electron block layer. The electron block layer may function to minimize electron-hole recombination at the second conductive type semiconductor layer 160, wherein emission of light is requested from the active layer 150 and the electron-hole recombination is not desirable.

In the light-emitting device 200 according to at least one example embodiment of FIG. 5, a V-pit 221, without a separate V-pit generation layer, may be directly formed from the first conductive type semiconductor layer 210. To do so, a dopant density, a deposition temperature, etc. for the first conductive type semiconductor layer 210 adjacent to the layer-quality improvement layer 130 may be adjusted during the manufacture, in consideration of a time when the V-pit 221 is formed.

The layer-quality improvement layer 130 may be arranged on the first conductive type semiconductor layer 210 in which the V-pit 221 is formed. The layer-quality improvement layer 130 may include $M_xGa_{1-x}N$, where M is Al or In and $0.01 \le x \le 0.3$. Alternatively, x may be in the range of $0.02 \le x \le 0.08$. If a value of the x is too small, an effect of layer quality improvement may be small. On the other hand, if the value of the x is too large, an emission characteristic may deteriorate.

The layer-quality improvement layer 130 may be formed on an entire top surface 123 of the first conductive type semiconductor layer 210. Also, the thickness of the layer-quality improvement layer 130 may be approximately constant in a vertical direction of the top surface 123 of the first conductive type semiconductor layer 210.

The superlattice layer 140, the active layer 150, the second conductive type semiconductor layer 160, and an ohmic electrode layer 170 that are arranged above the layer-quality improvement layer 130 are described above with reference to FIG. 1, and thus, detailed descriptions thereof are omitted here.

Figure 6:
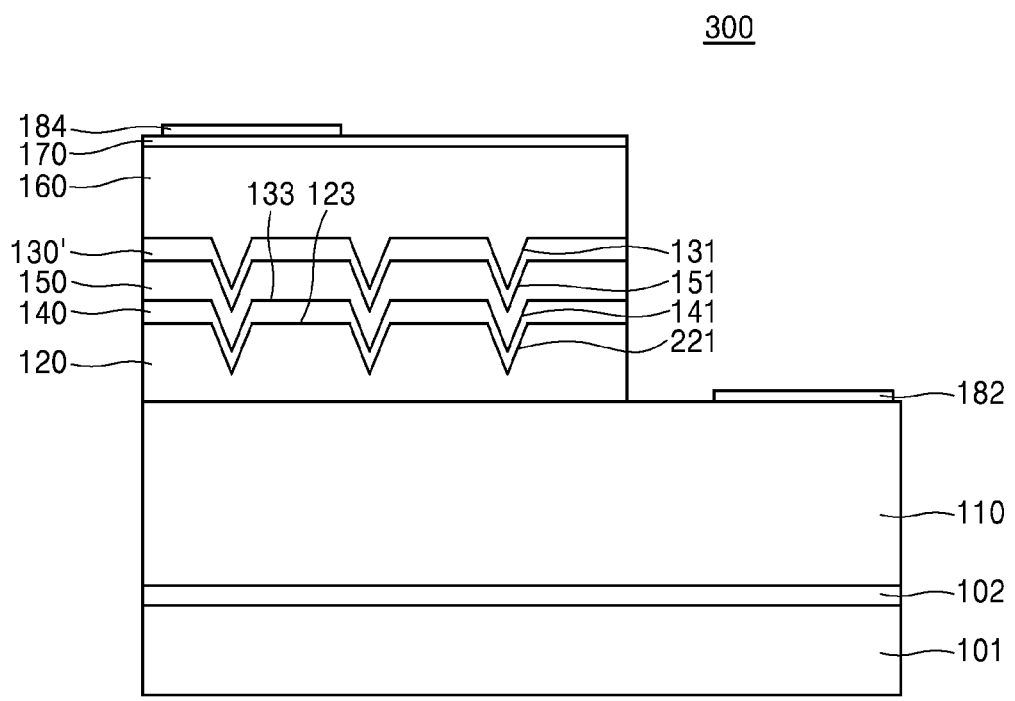

FIG. 6 is a cross-sectional side view of a light-emitting device 300, according to at least one other example embodiment.

Referring to FIG. 6, the light-emitting device 300 has a structure in which a first conductive type semiconductor layer 110, a V-pit generation layer 120, a superlattice layer 140, an active layer 150, a layer-quality improvement layer 130', and a second conductive type semiconductor layer 160 are sequentially stacked on a substrate 101. In at least one example embodiment, the first conductive type semiconductor layer 110, the V-pit generation layer 120, the superlattice layer 140, the active layer 150, the layer-quality improvement layer 130', and the second conductive type semiconductor layer 160 may be collectively referred to as an emission stack.

The substrate 101 and a buffer layer 102 are described above with reference to FIG. 1, and thus, detailed descriptions thereof are omitted here.

Unlike the embodiment of FIG. 1, the layer-quality improvement layer 130' in at least one example embodiment of FIG. 6 may be disposed on the active layer 150.

The layer-quality improvement layer 130' may include $M_xGa_{1-x}N$, where M is Al or In and $0.01 \le x \le 0.3$. Alternatively, x may be in the range of $0.02 \le x \le 0.08$. If a value of the x is too small, an effect of layer quality improvement may be small. On the other hand, if the value of the x is too large, an emission characteristic may deteriorate.

Alternatively, the layer-quality improvement layer 130' may have a multistack structure in which a GaN layer and an $M_xGa_{1-x}N$ layer are alternately stacked, where M is Al or In and $0.01 \le x \le 0.3$. Alternatively, the layer-quality improvement layer 130' may be a superlattice layer of GaN and $M_xGa_{1-x}N$, where M is Al or In and $0.01 \le x \le 0.3$. A thickness of the layer-quality improvement layer 130' may be about 20 nm through about 100 nm.

The layer-quality improvement layer 130' may be formed on an entire top surface of the active layer 150. Also, the thickness of the layer-quality improvement layer 130' may be approximately constant in a vertical direction of the top surface of the active layer 150. As described above, since the layer-quality improvement layer 130' is formed on the active layer 150, the layer-quality improvement layer 130' may at least partially fill a V-pit 151 of the active layer 150 that corresponds to a V-pit 131 of the layer-quality improvement layer 130'.

Also, the V-pit 131 of the layer-quality improvement layer 130' may be covered by the second conductive type semiconductor layer 160.

Figure 7:
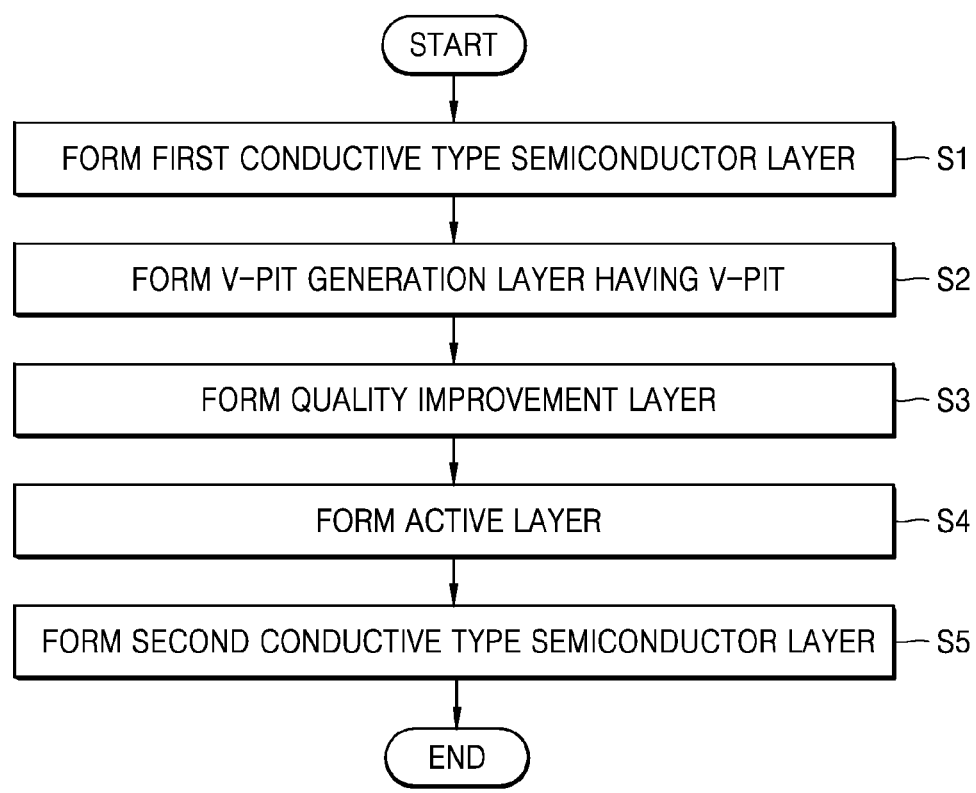
FIG. 7 illustrates a flowchart of a method of manufacturing a light-emitting device, according to an example embodiment.

FIG. 7 illustrates a flowchart of a method of manufacturing a light-emitting device, according to at least one example embodiment. FIGS. 11A through 11F illustrate cross-sectional side views of the light-emitting device manufactured by using the method of FIG. 7.

Figure 11A:
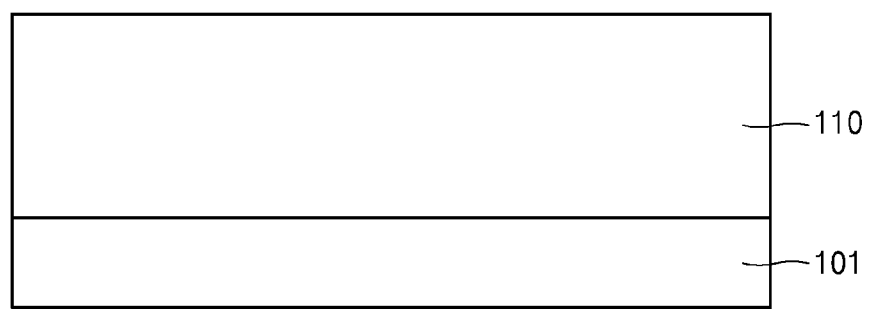
FIGS. 11A through 11F are cross-sectional side views illustrating a light-emitting device manufactured by using the method.

Referring to FIGS. 7 and 11A, a first conductive type semiconductor layer 110 may be formed on a substrate 101 (51). Detailed configurations of the substrate 101 and the first conductive type semiconductor layer 110 are described above with reference to FIG. 1.

If the first conductive type semiconductor layer 110 is an n-GaN layer, a gallium precursor, a nitrogen precursor, a precursor of an n-type dopant, and a carrier gas may be supplied into a reaction chamber in which the substrate 101 is loaded. The first conductive type semiconductor layer 110 may be formed by MOCVD. However, a deposition method is not limited thereto.

The gallium precursor may be trimethylgallium (TMG), triethylgallium (TEG), diethylgallium chloride, or the like. The nitrogen precursor may be ammonia, nitrogen, or an excited species of ammonia and/or nitrogen. In one or other embodiments, the n-type dopant may be silicon and its precursor may be silane.

Figure 11B:
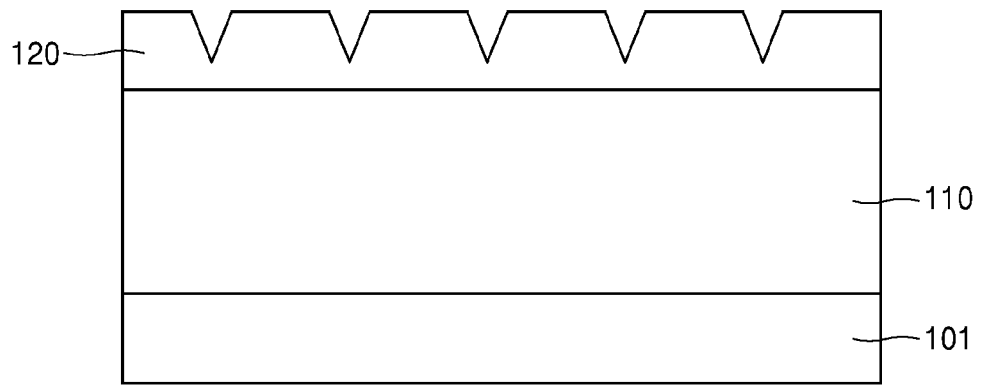

Referring to FIGS. 7 and 11B, a V-pit generation layer 120 having a plurality of V-pits 121 is formed on the first conductive type semiconductor layer 110 (S2).

The V-pit generation layer 120 may be formed by supplying the gallium precursor, the nitrogen precursor, and the carrier gas into the reaction chamber. Also, a time when the V-pit 121 is formed may be appropriately controlled by varying a reaction temperature. A height H of the V-pit generation layer 120 may be about 250 nm through 500 nm.

Figure 11C:
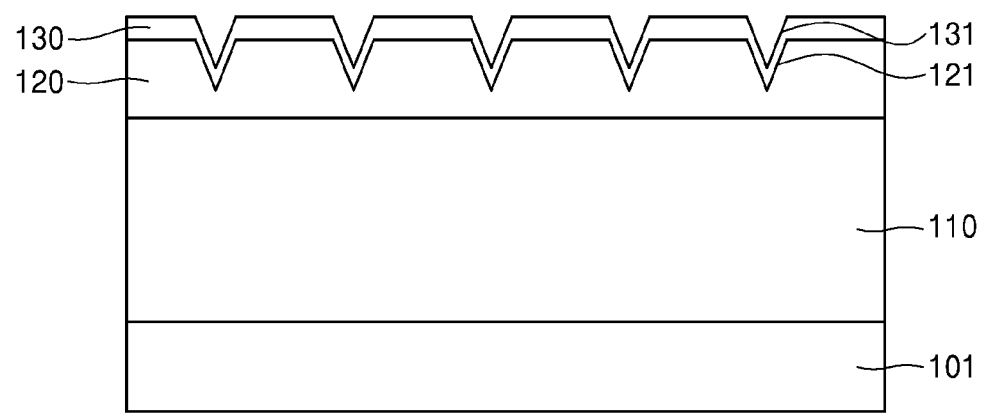
Figure 11D:
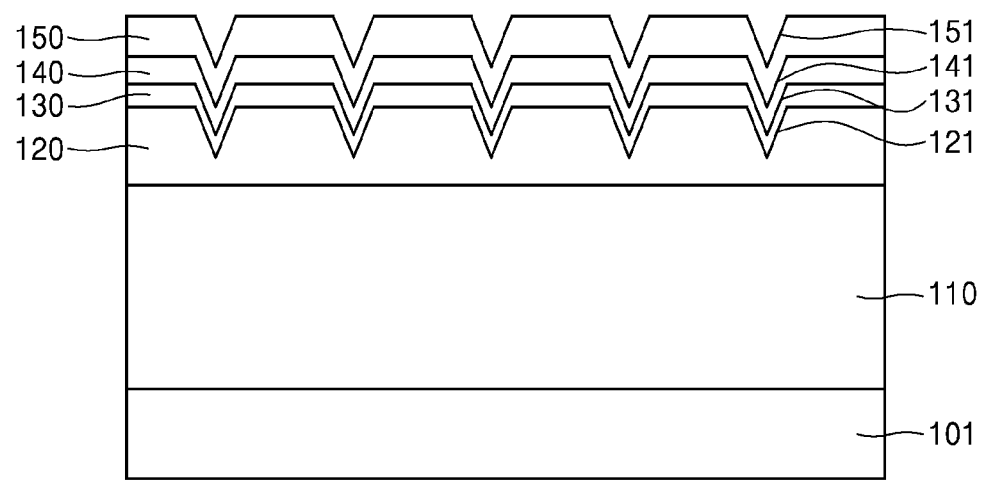

Referring to FIGS. 7 and 11C, a layer-quality improvement layer 130 is formed on the V-pit generation layer 120 (S3).

Figure 8:
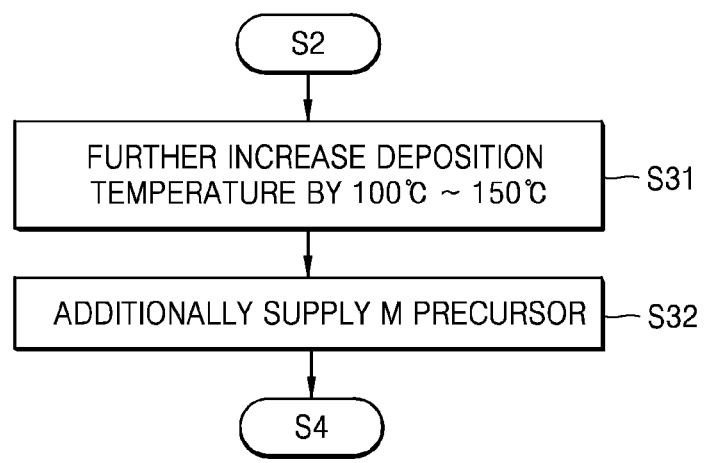
FIGS. 8 and 9 illustrates flowcharts of a method of manufacturing a layer-quality improvement layer according to example embodiments.

FIG. 8 illustrates a flowchart of a method of manufacturing the layer-quality improvement layer 130.

Referring to FIG. 8, deposition may be performed at a temperature that is increased by about 100 through 150° C. compared to a temperature at a time when the V-pit generation layer 120 is generated (S31). Also, a precursor of metal M (M is Al or In) may be additionally supplied (S32).

An aluminum precursor may be, but is not limited to, at least one material selected from the group consisting of trimethylaluminum, triethylaluminum, tris(dimethylamide) aluminum, triisobutylaluminum, aluminumtris(2,2,6,6-tetramethyl-3,5-heptanedionate), $AlMe_2H$, $[Al(OsBu)_3]_4$, $Al(CH_3COCHCOCH_3)_3$, $AlCl_3$, $AlBr_3$, $AlI_3$, $Al(OiPr)_3$, $[Al(NMe_2)_3]_2$, $Al(iBu)_2Cl$, $Al(iBu)_3$, $Al(iBu)_2H$, $AlEt_2Cl$, $Et_3Al_2(OsBu)_3$, $Al(THD)_3$, $H_3AlNMe_3$, $H_3AlNEt_3$, $H_3AlNMe_2Et$, and $H_3AlMeEt_2$.

An indium precursor may be, but is not limited to, at least one material selected from the group consisting of trimethylindium, triethylindium, triisopropylindium, tributylindium, tritertiarybutylindium, trimethoxyindium, triethoxyindium, triisopropoxyindium, dimethylisopropoxyindium, diethylisopropoxyindium, dimethylethylindium, diethylmethylindium, dimethylisopropylindium, diethylisopropylindium, and dimethyl-tert-butylindium.

Referring to FIG. 8, the precursor of metal M is additionally supplied after the deposition temperature is increased, but an order of the processes may be switched or the processes may be simultaneously performed.

Figure 9:
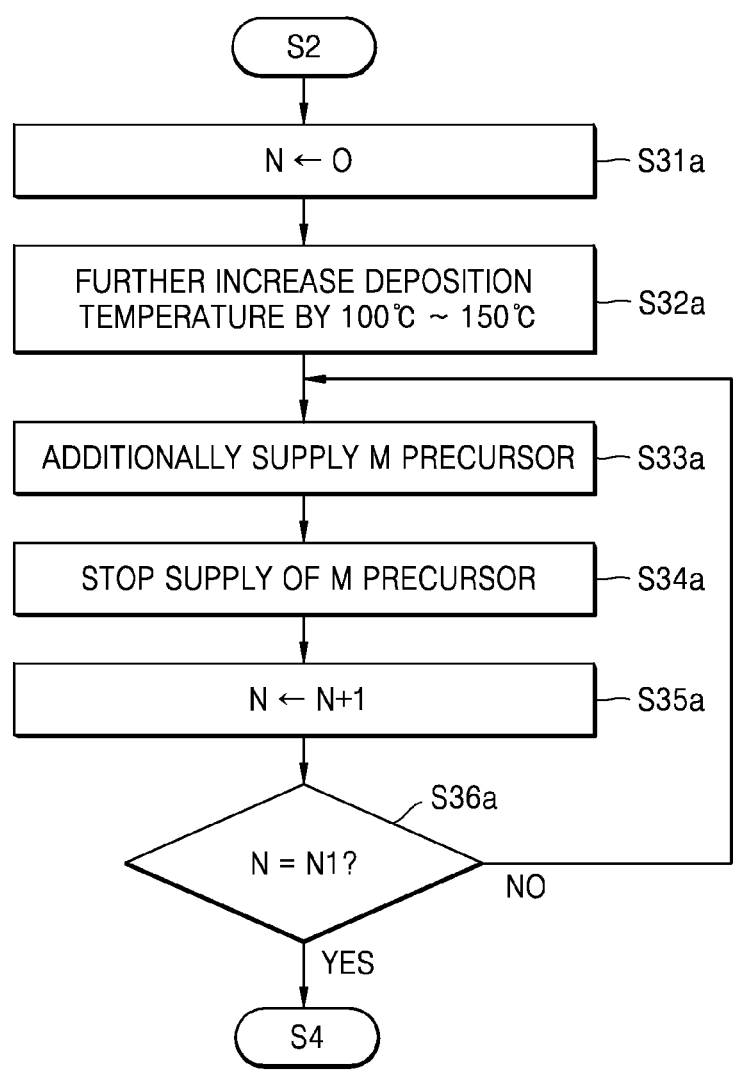

FIG. 9 illustrates a flowchart of the method of forming the layer-quality improvement layer, according to at least one other example embodiment.

Referring to FIG. 9, a counter to count a number of times that repeated operations are performed is reset (S31a).

Afterward, a reaction temperature in a chamber may be increased to a temperature that is higher by about 100 through 150° C. in comparison to a temperature for forming the V-pit generation layer 120 (S32a).

Also, a supply (S33a) of a precursor of metal M and a supply stop (S34a) of the precursor of metal M are repeated until the supply and the supply stop reach a predetermined or desired number of times (S35a and S36a). That is, whenever the supply (S33a) of the precursor of metal M and the supply stop (S34a) of the precursor of metal M are repeated once, the counter is increased by 1 (S35a), and if the counter reaches the predetermined or desired number of times, a following operation is performed, and if not, the supply (S33a) of the precursor of metal M and the supply stop (S34a) of the precursor of metal M are repeated (S36a).

Figure 10:
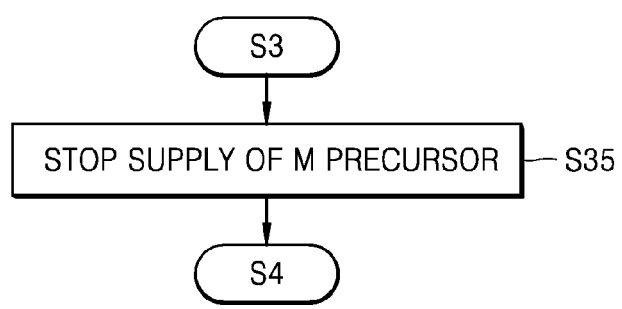
FIG. 10 illustrates a flowchart of a case in which a superlattice layer is further formed just before an active layer is formed.

Referring back to FIGS. 7 and 11D, an active layer 150 is formed on the layer-quality improvement layer 130 (S4). FIG. 10 is a flowchart of a case in which a superlattice layer 140 is further formed just before the active layer 150 is formed (S35). Referring to FIG. 10, the superlattice layer 140 may be formed after the layer-quality improvement layer 130 is formed and before the active layer 150 is formed.

The superlattice layer 140 may be formed while the superlattice layer 140 grows at a temperature equal to or less than a growth temperature of the layer-quality improvement layer 130. A growth temperature of the superlattice layer 140 may be about 600 through 1,000° C.

If the active layer 150 is an MQW including an InGaN well layer and a GaN barrier layer, a gallium source gas and a nitrogen source gas may be supplied into the reaction chamber so as to form the GaN barrier layer, and an indium source gas may be further supplied into the reaction chamber so as to form the InGaN well layer. The source gases to form the GaN barrier layer and the InGaN well layer may be simultaneously supplied or may be sequentially supplied in an alternating manner into the reaction chamber.

Figure 11E:
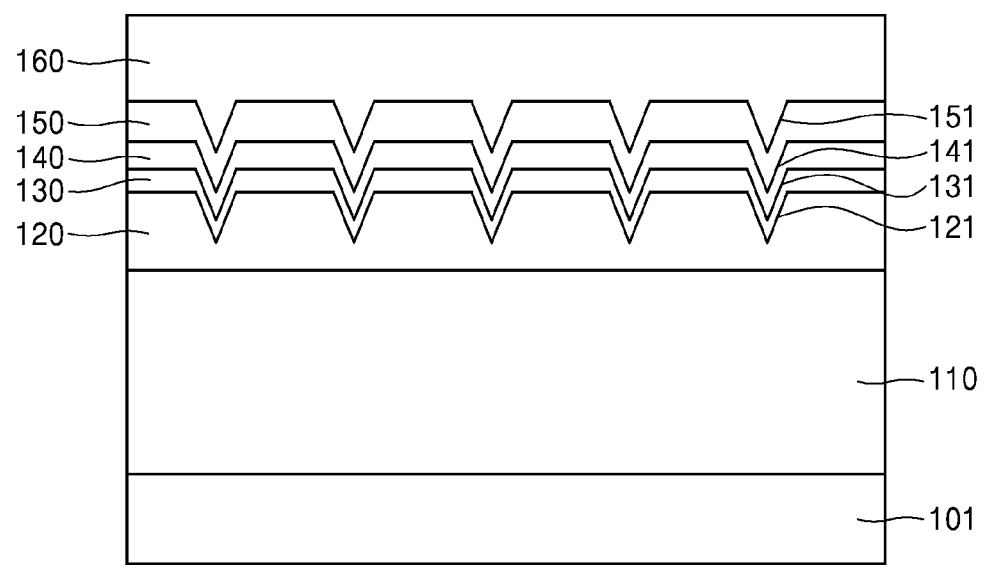

Referring to FIGS. 7 and 11E, a second conductive type semiconductor layer 160 may be formed on the active layer 150.

If the second conductive type semiconductor layer 160 is a p-GaN layer, a reaction may take place in the reaction chamber by supplying a gallium precursor and a nitrogen precursor supplied thereto. A precursor of a p-type dopant may be, but is not limited to, Cp2Mg.

Figure 11F:
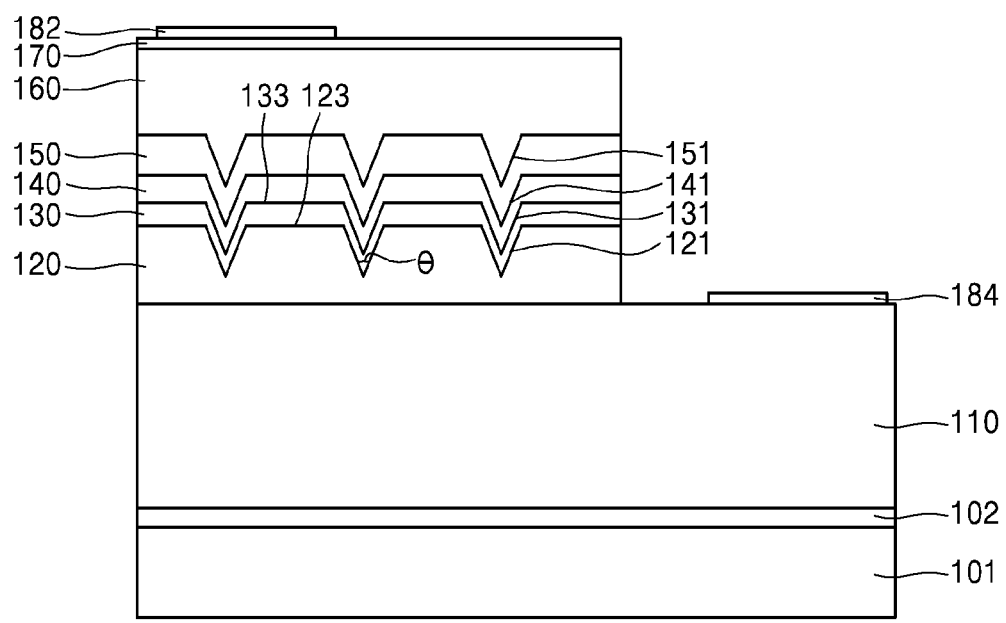

Referring to FIG. 11F, an ohmic electrode layer 170 is formed on the second conductive type semiconductor layer 160 and then a mesa is formed, so that the first conductive type semiconductor layer 110 is exposed. Afterward, a first electrode 182 and a second electrode 184 may be formed on the first conductive type semiconductor layer 110 and the second conductive type semiconductor layer 160, respectively.

Hereinafter, examples and comparative examples are provided to further describe configuration and effects of the inventive concepts, but the scope of the inventive concepts is not limited to the examples.

Comparative Example 1

A first conductive type semiconductor layer was formed on a substrate, and a V-pit generation layer was formed on the first conductive type semiconductor layer.

Comparative Example 2

In the Comparative Example 2, the V-pit generation layer was formed in a same manner as the Comparative Example 1, except that a temperature was increased by 100° C. when a top surface of the V-pit generation layer was formed.

Example 1

In the Example 1, the V-pit generation layer was formed in a same manner as the Comparative Example 1, except that a temperature was increased by 100° C. and, simultaneously, trimethylaluminum was supplied as an aluminum precursor when a top surface portion of the V-pit generation layer was formed. A layer that is formed after the deposition temperature was increased and trimethylaluminum was supplied is a layer-quality improvement layer.

A roughness of top surfaces of structures obtained from the Example 1 and the Comparative Examples 1 and 2 was measured by using AFM, based on a root mean square (RMS). Here, a V-pit was not measured.

Figure 12:
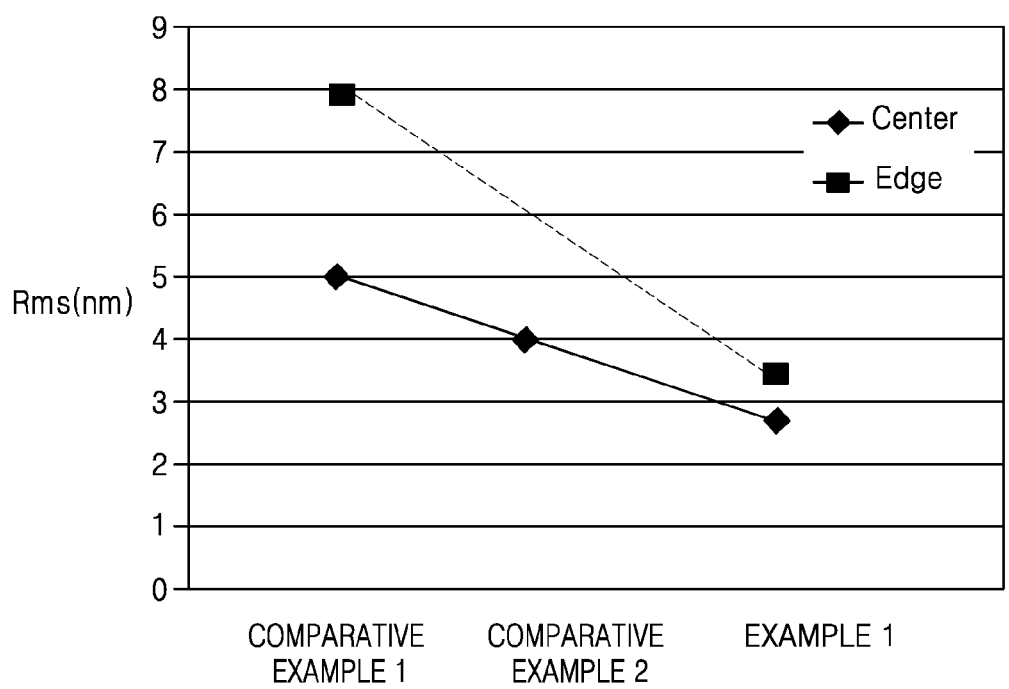
FIG. 12 is a graph illustrating a result obtained by measuring a roughness of top surfaces of structures of an embodiment 1 and comparative examples 1 and 2.

As a result, as shown in FIG. 12, the roughness of edge portions was decreased by at least a half, and the roughness of center portions was significantly decreased. In particular, referring to the Comparative Example 2 in which a temperature was increased and Al was not added, the roughness was improved in comparison to the Comparative Example 1 in which the temperature was not increased and Al was not added. However, it is apparent that an effect of the Example 1 in which the temperature was increased and Al was added was significant. Here, the roughness of the top surfaces was measured for description, but even if an evenness of an interface (a boundary surface) between layers in a cross-section was measured, a result was similar.

Example 2

The V-pit generation layer was formed in a same manner as the Comparative Example 1, except that a temperature was increased by 100° C. and, simultaneously, trimethylindium was supplied as an indium precursor when a top surface portion of the V-pit generation layer was formed.

As a result, compared to the Comparative Example 1, the Example 2 shows a roughness decrease by 60%.

An active layer was additionally stacked on each of the structures of the Examples 1 and 2 and the Comparative Example 1, and a thickness deviation in the active layer was measured. In order to measure the thickness deviation in the active layer, X-ray diffraction (XRD) was used.

As a result, thickness deviations were obtained as in Table 1.

TABLE 1

|  | Example 1 | Example 2 | Comparative Example 1 |
| --- | --- | --- | --- |
| Thickness of active layer (center, μm) | 8.10 | 7.92 | 7.86 |
| Thickness of active layer (edge, μm) | 8.13 | 8.00 | 8.09 |
| Difference between center-edge (absolute value) | 0.03 | 0.08 | 0.23 |

As shown in Table 1, in the thickness of the active layer that was manufactured according to the inventive concepts, a deviation between a center portion and an edge portion was significantly decreased. That is, the deviation between the center portion and the edge portion in the Comparative Example 1 was 0.23 μm, but in the Examples 1 and 2, the deviations were 0.03 μm, 0.08 μm, respectively.

In addition, a light-emitting apparatus including the structure of the Example 1, and a light-emitting apparatus including the structure of the Comparative Example 1 were manufactured, and their luminescent qualities were examined. As a result, compared to the Comparative Example 1, the luminescent quality of the light-emitting apparatus of the Example 1 was improved by 1.5 Mw, based on a chip power at a BLU of 630 μm×970 μm.

Figure 13:
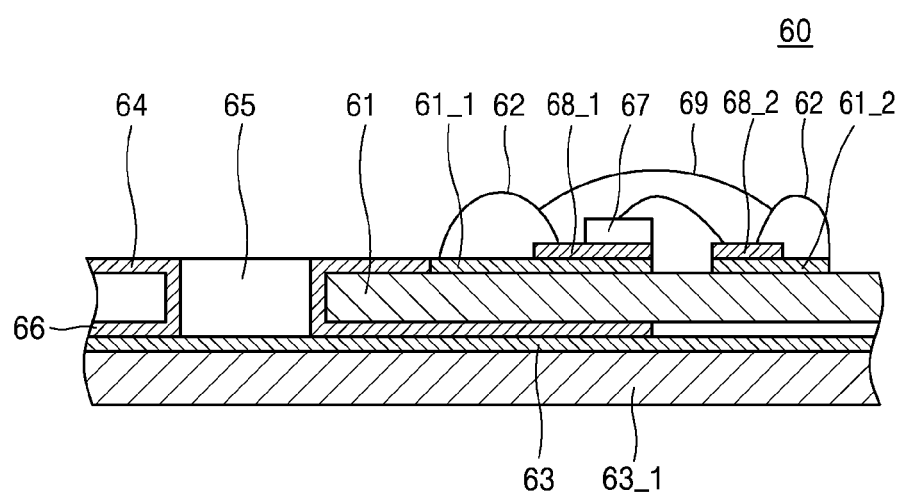
FIGS. 13 and 14 are cross-sectional side views of a light-emitting package, according to example embodiments.

FIG. 13 is a cross-sectional side view of a light-emitting package 60, according to at least one example embodiment.

Referring to FIG. 13, a substrate 61 is an insulation substrate and has a structure in which circuit patterns 61_1 and 61_2 formed of a copper laminate are formed on a top surface of the insulation substrate, and an insulation thin film layer 63 that is thinly coated as an insulation material may be formed on a bottom surface of the insulation substrate. In at least one example embodiment, various coating methods such as a sputtering method or a spraying method may be used. Also, top and bottom heat diffusion plates 64 and 66 may be formed on the top and bottom surfaces of the substrate 61 so as to dissipate heat that is generated in the light-emitting package 60, and in particular, the top heat diffusion plate 64 directly contacts the circuit pattern 61_1. For example, the insulation material that is used as the insulation thin film layer 63 has thermal conductivity that is significantly lower than that of a heat pad, but since the insulation thin film layer 63 has a very small thickness, the insulation thin film layer 63 may have a thermal resistance that is significantly lower than that of the heat pad. The heat that is generated in the light-emitting package 60 may be transferred to the bottom heat diffusion plate 66 via the top heat diffusion plate 64 and then may be dissipated to a sash 63_1.

Two through holes 65 may be formed in the substrate 61 and the top and bottom heat diffusion plates 64 and 66 so as to be vertical to the substrate 61. An LED package may include an LED chip 67 including one of the light-emitting devices 100, 200, and 300, LED electrodes 68_1 and 68_2, a plastic molding case 62, a lens 69, or the like. The substrate 61 may have a circuit pattern that is formed by laminating a copper layer onto an FR4-core that is a ceramic or epoxy resin-based material and then by performing an etching process.

The light-emitting package 60 may have a structure in which at least one of a red LED that emits red light, a green LED that emits green light, and a blue LED that emits blue light is mounted. At least one phosphor material may be coated on a top surface of the blue LED.

The phosphor material may be sprayed while including a particle powder that is mixed with a resin. The phosphor powder may be fired and thus may be formed in the form of a ceramic plate layer on the top surface of the LED. A size of the phosphor powder may be from 1 μm to 50 μm or, for example, from 5 μm to 20 μm. In a case of a nano phosphor, it may be a quantum dot having a size of from 1 nm to 500 nm or, for example, from 10 nm to 50 nm.

Figure 14:
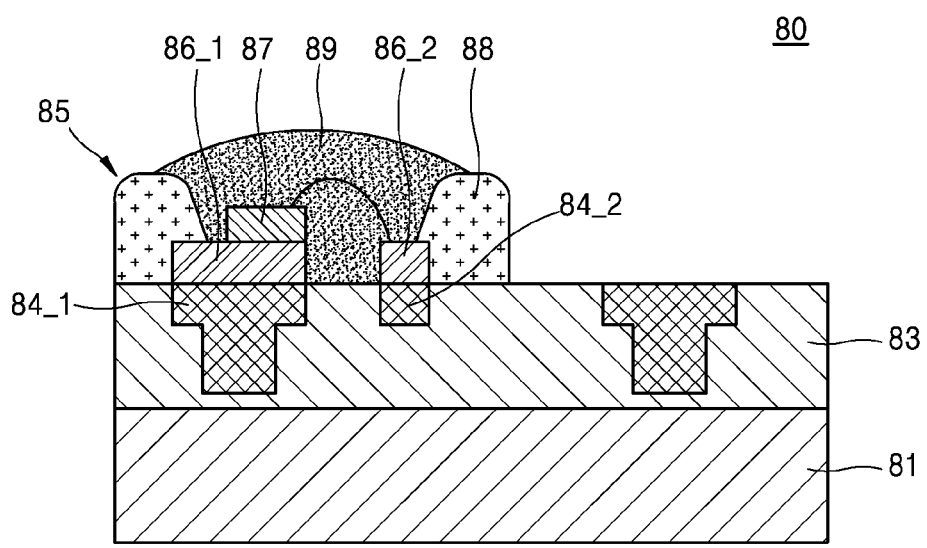

FIG. 14 is a cross-sectional side view of a light-emitting package 80, according to at least one other example embodiment.

Referring to FIG. 14, the light-emitting package 80 includes an insulation resin 83 that is coated on a metal substrate 81, circuit patterns 84_1 and 84_2 that are formed in the insulation resin 83, and an LED chip that is mounted to be electrically connected with the circuit patterns 84_1 and 84_2. In at least one example embodiment, the insulation resin 83 having a thickness that is equal to or less than 200 μm may be laminated as a solid-state film on a metal substrate, or may be coated in a liquid state on the metal substrate by using spin coating or a molding method using a blade. A size of an insulation resin layer having an insulation circuit pattern may be equal to or less than a size of the metal substrate. Also, the circuit patterns 84_1 and 84_2 are formed in a manner in which a metal material such as copper is filled in shapes of the circuit patterns 84_1 and 84_2 that are engraved in the insulation resin 83.

Referring to FIG. 14, an LED module 85 includes an LED chip 87, LED electrodes 86_1 and 86_2, a plastic molding case 88, and a lens 89.

The LED chip 87 may include the light-emitting device 100, 200, or 300, and may emit blue light, green light, or red light, according to a type of a compound semiconductor consisting of the LED chip 87. Alternatively, the LED chip 87 may emit ultraviolet (UV) rays. In one or more example embodiments, the light-emitting device 100, 200, or 300 may be formed of an UV light diode chip, a laser diode chip, or an organic light-emitting device (OLED) chip. However, according to one or more example embodiments of the inventive concepts, the light-emitting device 100, 200, or 300 may be formed of various light devices other than the aforementioned elements.

The light-emitting device 100, 200, or 300 may be configured so that a Color Rendering Index (CRI) can be adjusted from a CRI of 40 to a CRI of 100 and also may generate a variety of white light in the color temperature range between from about 2,000K to about 20,000K, and when required, the light-emitting device 100, 200, or 300 may adjust a lighting color according to the ambient atmosphere or mood by generating visible light having a purple, blue, green, red, or orange color, or infrared light. Also, the light-emitting device 100, 200, or 300 may generate light having a special wavelength capable of promoting growth of plants.

Figure 15:
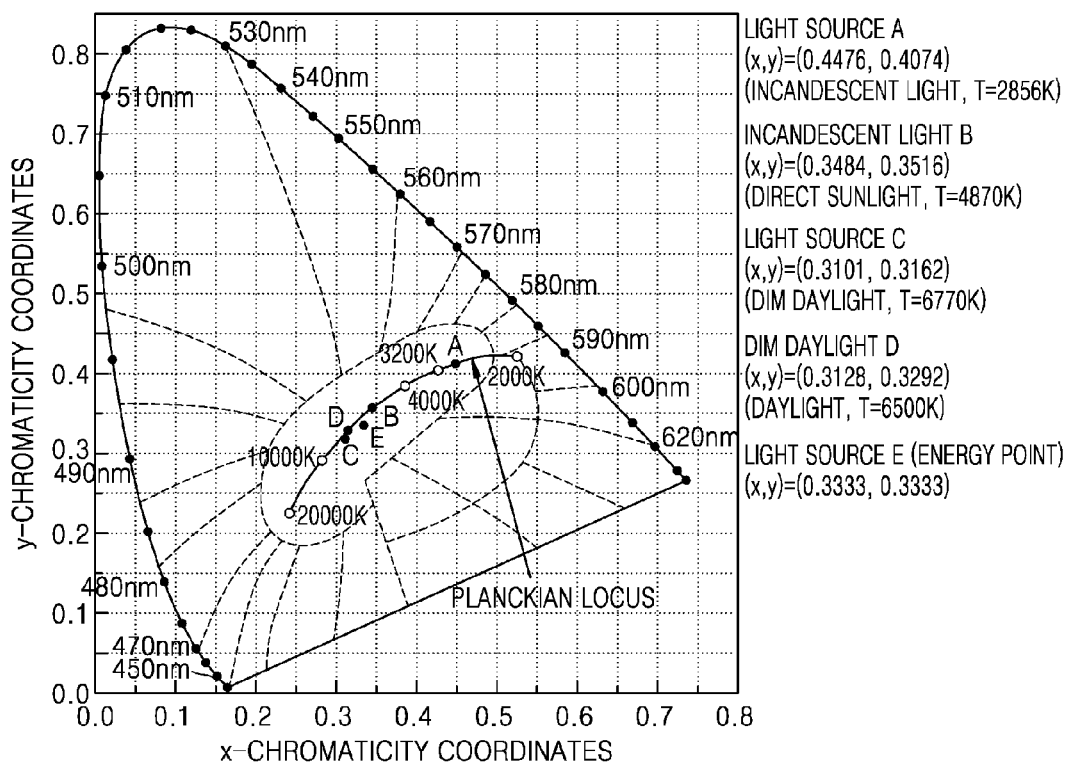
FIG. 15 illustrates a color temperature spectrum related to light that is emitted from the light-emitting device, according to an example embodiment.

White light that corresponds to a combination of light emitted by the blue light-emitting device and light emitted by the yellow, green, and red phosphors and/or green and red light-emitting devices may have at least two peak wavelengths and may be positioned in a region defined by (x,y) coordinates (0.4476, 0.4074), (0.3484, 0.3516), (0.3101, 0.3162), (0.3128, 0.3292), and (0.3333, 0.3333) of a CIE 1931 coordinate system. Alternatively, the white light may be positioned in a region that is surrounded by the line segment and a black body radiation spectrum. A color temperature of the white light may be between about 2,000K and about 20,000K. FIG. 15 illustrates a color temperature (e.g., a Planckian spectrum).

For example, phosphors that are used in an LED may have general formulas and colors as below:

oxide-based phosphors: yellow and green (Y, Lu, Se, La, Gd, Sm)$_3$(Ga, Al)$_5$O$_{12}$:Ce, blue (Y, Lu, Se, La, Gd, Sm)$_3$(Ga, Al)$_5$O$_{12}$:Ce;

silicate-based phosphors: yellow and green (Ba, Sr)$_2$SiO$_4$:Eu, yellow and orange (Ba, Sr)$_3$SiO$_5$:Eu;

nitride-based phosphors: green β-SiAlON:Eu, yellow (La, Gd, Lu, Y, Sc)$_3$Si$_6$N$_{11}$:Ce, orange α-SiAlON:Eu, red (Sr, Ca)AlSiN$_3$:Eu, (Sr, Ca)AlSi(ON)$_3$:Eu, (Sr, Ca)$_2$Si$_5$N$_8$:Eu, (Sr, Ca)$_2$Si$_5$(ON)$_8$:Eu, (Sr, Ba)SiAl$_4$N$_7$:Eu;

sulfide-based phosphors: red (Sr, Ca)S:Eu, (Y, Gd)$_2$O$_2$S:Eu, green SrGa$_2$S$_4$:Eu; and fluoride-based phosphors: KSF-based red color K$_2$SiF$_6$:Mn$^{4+}$.

In general, the general formulas of the phosphors must match with the stoichiometry, and each element may be substituted by another element in the same group of the periodic table. For example, Sr may be substituted for Ba, Ca, Mg, or the like of the alkaline-earth metal elements group II, and Y may be substituted for Tb, Lu, Sc, Gd, or the like of lanthanide-base elements. Also, Eu that is an activator may be substituted for Ce, Tb, Pr, Er, Yb, or the like according to a desired energy level, and the activator may be solely used or a sub-activator may be additionally used for a characteristic change.

As a substitute for the phosphors, materials such as a quantum dot or the like may be used, and in at least one example embodiment, the LED, the phosphors, and the quantum dot may be combined or the LED and the quantum dot may be used.

Figure 16:
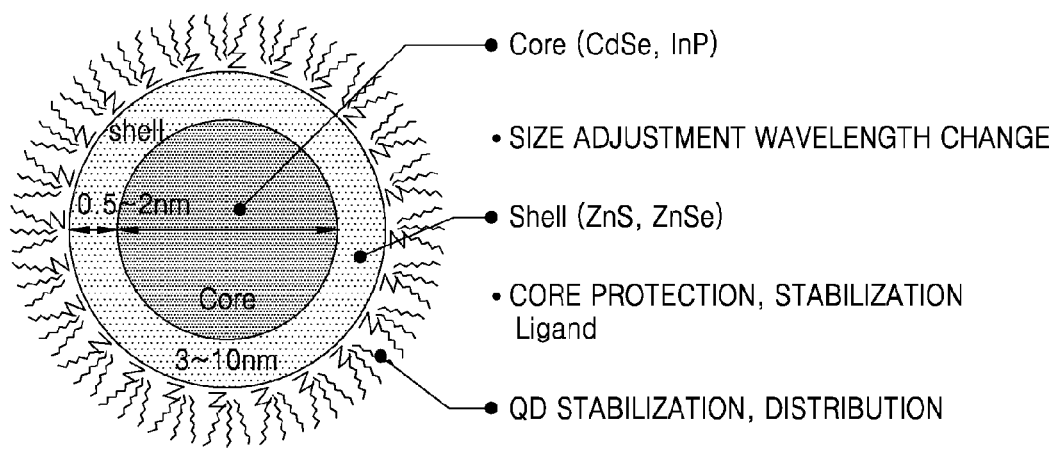
FIG. 16 illustrates an example of a structure of a quantum dot (QD) that may be used in the light-emitting device, according to an example embodiment.

The quantum dot may have a structure of a core (from 3 nm to 10 nm) such as CdSe, InP, or the like, a shell (from 0.5 nm to 2 nm) such as ZnS, ZnSe, or the like, and a ligand for stabilization of the core-shell, and may realize various colors according to sizes. FIG. 16 illustrates an example of the structure of the quantum dot.

FIG. 17 illustrates phosphor types according to application fields of a white light-emitting device using a blue-light LED.

Phosphors or quantum dots may be sprayed on an LED chip or a light-emitting device, may be used as a covering in the form of a thin-film, or may be attached in the form of a film-sheet or a ceramic phosphor sheet.

The phosphors or the quantum dots may be sprayed by using a dispensing method, a spray coating method, or the like, and in this regard, the dispensing method includes a pneumatic method and a mechanical method such as a screw, a linear type, or the like. A jetting method may allow a dotting amount control via a minute-amount discharge operation, and a color-coordinates control via the dotting amount control. A method of collectively spraying phosphors on a wafer level or a substrate of the light-emitting device may facilitate a control of productivity and a thickness of the light-emitting device.

The method of covering the phosphors or the quantum dots in the form of a thin-film on the light-emitting device or the LED chip may be performed by using an electrophoretic deposition method, a screen printing method, or a phosphor molding method, and one of the aforementioned methods may be used according to whether it is required to cover side surfaces of the LED chip.

In order to control an efficiency of a long-wavelength light-emitting phosphor that re-absorbs light that is emitted at a short-wavelength and that is from among at least two types of phosphors having different emission wavelengths, the at least two types of phosphors having different emission wavelengths may be distinguished, and in order to minimize wavelength re-absorption and interference of the LED chip and the at least two types of phosphors, a DBR (ODR) layer may be arranged between layers.

In order to form a more uniform coating layer, the phosphors may be arranged in the form of a film or a ceramic sheet and then may be attached on the LED chip or the light-emitting device.

In order to vary a light efficiency and/or a light distribution characteristic, a light conversion material may be positioned in a remote manner, and in at least one example embodiment, the light conversion material may be positioned together with a light-transmitting polymer material, a glass material, or the like according to durability and heat resistance of the light conversion material.

Since the phosphor spraying technology performs a role in the determination of a luminescent quality of an LED device, various techniques to control a thickness of a phosphor-coated layer, more uniform distribution of the phosphors, or the like are being studied. Also, the quantum dot may be positioned at the LED chip or the light-emitting device in the same manner as the phosphors, and in this regard, the quantum dot may be positioned between glass materials or between light-transmitting polymer materials, thereby performing light conversion.

In order to protect the LED chip or the light-emitting device against an external environment and/or to improve an extraction efficiency of light that is externally emitted from the light-emitting device, a light-transmitting material as a filling material may be arranged on the LED chip or the light-emitting device.

In at least one example embodiment, the light-transmitting material may be a transparent organic solvent including epoxy, silicone, a hybrid of epoxy and silicone, or the like, and may be used after being hardened via heating, light irradiation, a time-elapse, or the like.

Regarding silicone, polydimethyl siloxane is classified into a methyl-base, and polymethylphenyl siloxane is classified into a phenyl-base, and depending on the methyl-base and the phenyl-base, silicone differs in refractive index, water-permeation rate, light transmittance, light fastness, and heat-resistance. Also, silicone differs in hardening time according to a cross linker and a catalyst, thereby affecting distribution of the phosphors.

The light extraction efficiency varies according to a refractive index of the filling material, and in order to reduce or minimize a difference between a refractive index of an outermost medium of emitted blue light of the LED chip and a refractive index of the blue light that is emitted to the outside air, at least two types of silicon having different refractive indexes may be sequentially stacked.

In general, the methyl-base has the improved heat-resistance, and variation due to a temperature increase is decreased in order of the phenyl-base, the hybrid, and epoxy. Silicone may be divided into a gel type, an elastomer type, and a resin type according to a hardness level.

The light-emitting device may further include a lens to radially guide light that is irradiated from a light source, and in this regard, a pre-made lens may be attached on the LED chip or the light-emitting device, or a liquid organic solvent may be injected into a molding frame in which the LED chip or the light-emitting device is mounted and then may be hardened.

The lens may be directly attached on the filling material on the LED chip or may be separated from the filling material by bonding only an outer side of the light-emitting device and an outer side of the lens. The liquid organic solvent may be injected into the molding frame via injection molding, transfer molding, compression molding, or the like.

According to a shape (e.g., a concave shape, a convex shape, a concave-convex shape, a conical shape, a geometrical shape, or the like) of the lens, the light distribution characteristic of the light-emitting device may vary, and the shape of the lens may be changed according to requirements for the light efficiency and the light distribution characteristic.

Figure 19:
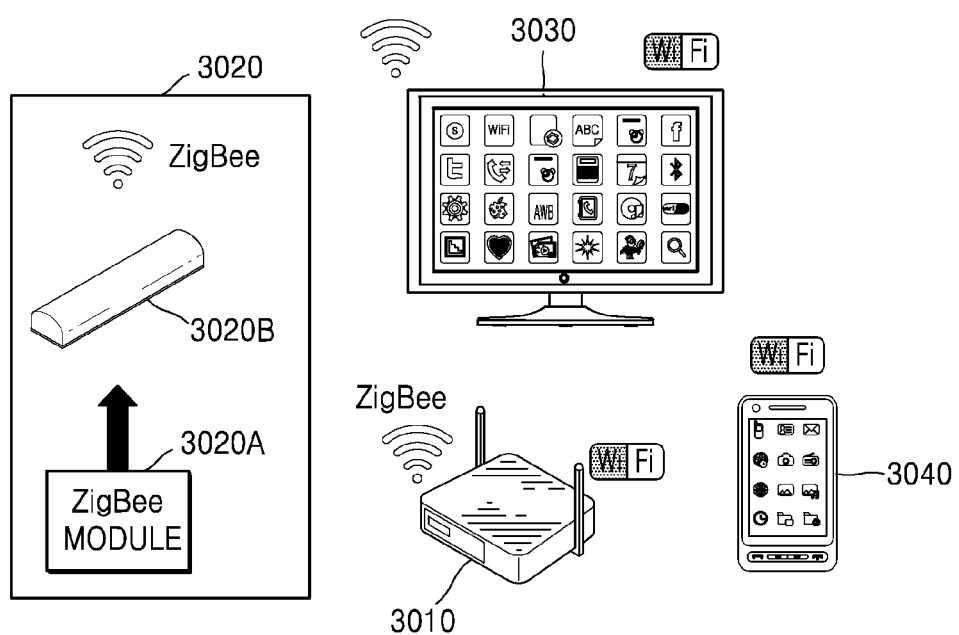

FIGS. 18 and 19 illustrate a home network to which a lighting system using a light-emitting device is applied, according to at least one example embodiment of the inventive concept.

As illustrated in FIG. 18, the home network may include a home wireless router 2000, a gateway hub 2010, a ZigBee module 2020, an LED lamp 2030, a garage door lock 2040, a wireless door lock 2050, home application 2060, a cell or smartphone 2070, a wall-mounted switch 2080, and a cloud network 2090.

According to operating statuses of a bedroom, a living room, an entrance, a garage, electric home appliances, or the like and ambient environments/situations, on/off, color temperature, CRI, and/or illumination brightness of the LED lamp 2030 may be automatically adjusted by using in-house wireless communication such as ZigBee, Wi-Fi, LiFi, or the like.

For example, as illustrated in FIG. 19, according to a type of a program broadcasted on a TV 3030 or brightness of a screen of the TV 3030, illumination brightness, a color temperature, and/or a CRI of an LED lamp 3020B may be automatically adjusted by using a gateway 3010 and a ZigBee module 3020A. If the program broadcasted on the TV 3030 is soap opera, illumination may be adjusted to have a color temperature equal to or less than 12,000K, e.g., a color temperature of 5,000K, and a color sense may also be adjusted according to a setting value, so that a cozy atmosphere may be created. On the other hand, if a program value indicates a comedy program, the home network may be configured so that illumination may be adjusted to have a color temperature equal to or greater than 5,000K and may have a blue-based white color, according to a setting value. Also, by using a smartphone 3040 or a computer via a home wireless communication protocol (ZigBee, WiFi, or LiFi), on/off, brightness, a color temperature, and/or a CRI of illumination, and home appliances such as the TV 3030, a refrigerator, an air conditioner, etc. that are connected to the home wireless communication protocol may be controlled. In at least one example embodiment, the LiFi communication means a short-distance wireless communication protocol that uses visible light of illumination.

For example, the cell or smartphone 2070 may perform an operation of executing an illumination control application program and displaying a color-coordinates system as shown in FIG. 15, and an operation of mapping, by using a ZigBee, WiFi, or LiFi communication protocol, a sensor that interoperates with the color-coordinates system and is connected to all illuminating apparatuses installed in a house, e.g., an operation of displaying positions, current setting values, and on/off state values of the illuminating apparatuses in the house, an operation of selecting an illuminating apparatus at a specific position and changing a state value of the illuminating apparatus, and an operation of changing a state of the illuminating apparatus according to the changed state value, and in this manner, the illuminating apparatuses or home appliances in the house may be controlled.

The ZigBee module 2020 or 3020A may be integrally modularized with a photo sensor and also may be integrally formed with a light-emitting apparatus.

When visible-light wireless communication technology is used, information is wirelessly delivered by using light in a visible wavelength band. Different from conventional wired optical communication technology and conventional infrared wireless communication, the visible-light wireless communication technology uses light in a visible wavelength band. Also, different from the conventional wired optical communication technology, the visible-light wireless communication technology uses a wireless environment. Also, the visible-light wireless communication technology is more convenient and/or physically secure since it is not regulated or controlled in terms of frequency usage, unlike the conventional radio frequency (RF) wireless communication, is unique since a user may check a communication link, and has a convergence characteristic by simultaneously allowing a light source to be used for its original purpose and an additional communication purpose.

Also, the LED illumination may be used as inner or outer light sources for vehicles. For the inner light sources, the LED illumination may be used as an inner light, a reading light, a dash board light, or the like for vehicles, and for the outer light sources, the LED illumination may be used as a headlight, a brake light, a direction guide light, a fog light, a daytime running light, or the like for vehicles.

An LED using a particular wavelength may promote a growth of plants, may stabilize human feelings, or may help treatment for a disease. The LED may be applied to a light source that is used in robots or various mechanical equipment. In addition to the LED having lower power consumption and/or a longer lifetime, it is possible to embody illumination of the inventive concepts in combination with a nature-friendly renewable energy power system such as a solar cell system, a wind power system, or the like.

As described above, the light-emitting device according to the one or more of the above example embodiments has an improved layer quality and thus has improved emission.

While the inventive concepts have been particularly shown and described with reference to example embodiments thereof, it will be understood that various changes in form and details may be made therein without departing from the spirit and scope of the following claims.

What is claimed is:

1. A light-emitting device comprising:
   a first conductive type semiconductor layer;
   a second conductive type semiconductor layer;
   an active layer between the first conductive type semiconductor layer and the second conductive type semiconductor layer, the active layer including a plurality of V-pits; and
   a layer-quality improvement layer between the first conductive type semiconductor layer and the second conductive type semiconductor layer, the layer-quality improvement layer including a plurality of V-pits, each of the plurality of V-pits of the layer quality improvement layer having substantially same size and shape as corresponding ones of the plurality of V-pits of the active layer,
   wherein the layer-quality improvement layer is a group III-V semiconductor layer including Al or In.

2. The light-emitting device of claim 1, wherein the layer-quality improvement layer includes $M_xGa_{1-x}N$, where M is Al or In and $0.01 \leq x \leq 0.3$.

3. The light-emitting device of claim 2, wherein a range of x is in $0.02 \leq x \leq 0.08$.

4. The light-emitting device of claim 2, wherein the layer-quality improvement layer is between the first conductive type semiconductor layer and the active layer.

5. The light-emitting device of claim 4, wherein a density of Al in the layer-quality improvement layer is substantially constant.

6. The light-emitting device of claim 4, wherein a roughness of a surface of the layer-quality improvement layer that is opposite the first conductive type semiconductor layer is substantially less than a roughness of a surface of the first conductive type semiconductor layer at an interface between the layer-quality improvement layer and the first conductive type semiconductor layer.

7. The light-emitting device of claim 6, wherein, when measured via an atomic force microscope (AFM), the roughness of the surface of the layer-quality improvement layer that is opposite the first conductive type semiconductor layer is equal to or less than 60% of the roughness of the surface of the first conductive type semiconductor layer at the interface between the layer-quality improvement layer and the first conductive type semiconductor layer.

8. The light-emitting device of claim 1, further comprising:
   a V-pit generation layer between the first conductive type semiconductor layer and the layer-quality improvement layer.

9. The light-emitting device of claim 8, wherein the layer-quality improvement layer is between the V-pit generation layer and the active layer.

10. The light-emitting device of claim 8, wherein,
    the V-pit generation layer includes a plurality of V-pits that form the plurality of V-pits of the active layer, and
    the layer-quality improvement layer is on a top surface of the V-pit generation layer.

11. The light-emitting device of claim 10, wherein the layer-quality improvement layer at least partially fills the plurality of V-pits of the V-pit generation layer.

12. The light-emitting device of claim 8, further comprising;
    a superlattice layer between the layer-quality improvement layer and the active layer.

13. The light-emitting device of claim 12, wherein,
    the plurality of V-pits of the layer-quality improvement layer are recessed into the plurality of V-pits of the V-pit generation layer, and
    the superlattice layer includes a plurality of V-pits recessed into the plurality of V-pits of the layer-quality improvement layer.

14. The light-emitting device of claim 13, wherein the plurality of V-pits of the active layer are recessed into the plurality of V-pits of the superlattice layer.

15. The light-emitting device of claim 8, wherein the layer-quality improvement layer includes a multistack structure comprising a plurality of GaN layers and $M_xGa_{1-x}N$ layers that are alternately stacked, wherein M is Al or In and $0.01 \leq x \leq 0.3$.

16. The light-emitting device of claim 8, wherein the layer-quality improvement layer includes a superlattice layer, and the superlattice layer includes GaN and $M_xGa_{1-x}N$, where M is Al or In and $0.01 \leq x \leq 0.3$.

17. The light-emitting device of claim 1, wherein the layer-quality improvement layer is between the active layer and the second conductive type semiconductor layer.

18. The light-emitting device of claim 17, wherein the plurality of V-pits of the layer-quality improvement layer are covered by the second conductive type semiconductor layer.

19. The light-emitting device of claim 17, further comprising:
a superlattice layer between the active layer and the first conductive type semiconductor layer,
wherein the plurality of V-pits of the active layer extend into the superlattice layer.

20. A light-emitting package comprising:
a package substrate;
the light-emitting device of claim 1, wherein the light-emitting device is on a printed circuit board; and
an encapsulation member that encapsulates the light-emitting device.

21. A light-emitting device comprising:
a first conductive type semiconductor layer;
a second conductive type semiconductor layer;
an active layer between the first conductive type semiconductor layer and the second conductive type semiconductor layer;
a V-pit generation layer between the first conductive type semiconductor layer and the active layer; and
a layer-quality improvement layer on at least a portion of a surface of the V-pit generation layer facing the active layer, the layer-quality improvement layer including an increased concentration of Al in relation to a concentration of Al in the V-pit generation layer.

22. The light-emitting device of claim 21, wherein,
the V-pit generation layer includes a GaN layer, and
the layer-quality improvement layer includes $Al_xGa_{1-x}N$, where $0.01 \leq x \leq 0.3$.

23. The light-emitting device of claim 22, wherein,
a thickness of the layer-quality improvement layer is about 5 through 20% of a thickness of the V-pit generation layer.

24. A method of manufacturing a light-emitting device, the method comprising:
forming a first conductive type semiconductor layer on a substrate;
forming a V-pit generation layer on the first conductive type semiconductor layer, the V-pit generation layer including a plurality of V-pits;
forming a layer-quality improvement layer on the V-pit generation layer, wherein the forming of the layer-quality improvement layer includes,
increasing a deposition temperature by about 100 through 150° C. with respect to a deposition temperature during the forming of the V-pit generation layer, and
additionally supplying an M precursor, wherein M is Al or In;
forming an active layer on the layer-quality improvement layer; and
forming a second conductive type semiconductor layer on the active layer.

25. The method of claim 24, wherein the forming of the layer-quality improvement layer includes,
increasing a deposition temperature by about 100 through 150° C. with respect to a deposition temperature during the forming of the V-pit generation layer; and
stopping the additionally supplying of the M precursor.

26. The method of claim 25, wherein the additionally supplying of the M precursor and the stopping of the additionally supplying are repeated until the layer-quality improvement layer has a desired thickness.

27. A method of manufacturing a light-emitting device, the method comprising:
forming a first conductive type semiconductor layer on a substrate;
forming a V-pit generation layer on the first conductive type semiconductor layer, the V-pit generation layer including a plurality of V-pits;
forming an active layer on the V-pit generation layer;
forming a layer-quality improvement layer, wherein the forming of the layer-quality improvement layer is performed after the forming of the V-pit generation layer and is based on,
increasing a temperature of the reaction chamber, and
supplying an M precursor to a reaction chamber, wherein M is Al or In; and
forming a second conductive type semiconductor layer on the active layer, subsequently to the forming the layer-quality improvement layer.

28. The method of claim 27, wherein the forming of the layer-quality improvement layer is performed before the forming of the active layer.

29. A light-emitting device comprising:
a first conductive type semiconductor layer;
a second conductive type semiconductor layer;
an active layer between the first conductive type semiconductor layer and the second conductive type semiconductor layer; and
at least one surface roughness improvement layer, including at least one of Al and In, between the first conductive type semiconductor layer and the second conductive type semiconductor layer.

30. The light-emitting device of claim 29, wherein the at least one surface roughness improvement layer is a layer-quality improvement layer comprising $M_xGa_{1-x}N$, where M is Al or In and $0.01 \leq x \leq 0.3$.

31. The light-emitting device of claim 29, wherein the at least one surface roughness improvement layer is a V-pit generation layer comprising $Al_xGa_{1-x}N$, where $0.01 \leq x \leq 0.3$.

32. The light-emitting device of claim 29, wherein the at least one surface roughness improvement layer includes a layer-quality improvement layer and a V-pit generation layer.

* * * * *